US011588012B2

(12) United States Patent
Kang et al.

(10) Patent No.: US 11,588,012 B2
(45) Date of Patent: Feb. 21, 2023

(54) SEMICONDUCTOR DEVICES AND METHOD OF MANUFACTURING THE SAME

(71) Applicant: Samsung Electronics Co., Ltd., Suwon-si (KR)

(72) Inventors: Jun-goo Kang, Seoul (KR); Sang-yeol Kang, Yongin-si (KR); Youn-soo Kim, Yongin-si (KR); Jin-su Lee, Hwaseong-si (KR); Hyung-suk Jung, Suwon-si (KR); Kyu-ho Cho, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 167 days.

(21) Appl. No.: 17/200,081

(22) Filed: Mar. 12, 2021

(65) Prior Publication Data

US 2021/0202693 A1 Jul. 1, 2021

Related U.S. Application Data

(63) Continuation of application No. 16/273,603, filed on Feb. 12, 2019, now Pat. No. 10,978,552.

(30) Foreign Application Priority Data

May 18, 2018 (KR) ........................ 10-2018-0057438

(51) Int. Cl.
*H01L 49/02* (2006.01)
*H01L 21/285* (2006.01)
(Continued)

(52) U.S. Cl.
CPC ............ *H01L 28/91* (2013.01); *C23C 16/405* (2013.01); *C23C 16/45525* (2013.01);
(Continued)

(58) Field of Classification Search
None
See application file for complete search history.

(56) References Cited

U.S. PATENT DOCUMENTS 4,959,745 A 9/1990 Suguro
5,284,639 A 2/1994 Sommers et al.
(Continued)

FOREIGN PATENT DOCUMENTS

JP 2006-257551 A 9/2006
KR 10-2000-0042448 A 7/2000
(Continued)

OTHER PUBLICATIONS

Partial European Search Report dated Oct. 23, 2019 issued in corresponding European Application No. 19173878.0.
(Continued)

*Primary Examiner* — Asok K Sarkar
(74) *Attorney, Agent, or Firm* — Harness, Dickey & Pierce, P.L.C.

(57) ABSTRACT

A method of manufacturing a semiconductor device includes forming a preliminary lower electrode layer on a substrate, the preliminary lower electrode layer including a niobium oxide; converting at least a portion of the preliminary lower electrode layer to a first lower electrode layer comprising a niobium nitride by performing a nitridation process on the preliminary lower electrode layer; forming a dielectric layer on the first lower electrode layer; and forming an upper electrode on the dielectric layer.

20 Claims, 27 Drawing Sheets

(51) Int. Cl.
  *C23C 16/40* (2006.01)
  *C23C 16/455* (2006.01)
  *C23C 16/56* (2006.01)
  *H01L 21/02* (2006.01)
  *H01L 21/321* (2006.01)
  *H01L 27/108* (2006.01)

(52) U.S. Cl.
  CPC ........ *C23C 16/56* (2013.01); *H01L 21/02181* (2013.01); *H01L 21/28556* (2013.01); *H01L 21/321* (2013.01); *H01L 27/10852* (2013.01); *H01L 27/10814* (2013.01); *H01L 27/10823* (2013.01)

(56) References Cited

U.S. PATENT DOCUMENTS

| | | |
|---|---|---|
| 5,780,115 A | 7/1998 | Park et al. |
| 6,706,115 B2 | 3/2004 | Leskela et al. |
| 7,413,982 B2 | 8/2008 | Levy |
| 7,482,037 B2 | 1/2009 | Derderian et al. |
| 7,635,623 B2 | 12/2009 | Bhat et al. |
| 7,678,708 B2 | 3/2010 | Vaartstra et al. |
| 7,691,757 B2 | 4/2010 | Haukka et al. |
| 7,837,797 B2 | 11/2010 | Derderian et al. |
| 8,007,865 B2 | 8/2011 | Delabie et al. |
| 8,105,896 B2 | 1/2012 | Bhat et al. |
| 8,114,219 B2 | 2/2012 | Vaartstra et al. |
| 8,394,725 B2 | 3/2013 | Vaartstra et al. |
| 8,460,989 B2 | 6/2013 | Blasco et al. |
| 8,497,566 B2 | 7/2013 | Bhat et al. |
| 8,563,392 B2 | 10/2013 | Malhotra et al. |
| 8,581,318 B1 | 11/2013 | Chen et al. |
| 8,685,494 B2 | 4/2014 | Lim et al. |
| 9,040,372 B2 | 5/2015 | Blasco et al. |
| 9,520,460 B2 | 12/2016 | Lee et al. |
| 9,536,940 B2 | 1/2017 | Song et al. |
| 9,773,861 B2 | 9/2017 | Lee et al. |
| 2004/0087081 A1 | 5/2004 | Aitchison et al. |
| 2006/0121733 A1 | 6/2006 | Kilpela et al. |
| 2007/0077759 A1 | 4/2007 | Nakanishi |
| 2007/0128858 A1 | 6/2007 | Haukka et al. |
| 2008/0038466 A1 | 2/2008 | Reuter et al. |
| 2008/0272421 A1 | 11/2008 | Bhat |
| 2011/0095397 A1 | 4/2011 | Chung et al. |
| 2011/0102968 A1 | 5/2011 | Choi et al. |
| 2012/0068255 A1 | 3/2012 | Lee et al. |
| 2012/0086072 A1 | 4/2012 | Yun et al. |
| 2012/0126300 A1* | 5/2012 | Park .................... H01G 4/33 257/296 |
| 2013/0285206 A1 | 10/2013 | Yang |
| 2014/0327062 A1 | 11/2014 | Park et al. |
| 2015/0091133 A1 | 4/2015 | Cho et al. |
| 2016/0251756 A1 | 9/2016 | Lansalot-Matras et al. |
| 2017/0004967 A1 | 1/2017 | Kil et al. |
| 2017/0018604 A1 | 1/2017 | Ahn et al. |
| 2017/0062205 A1 | 3/2017 | Chang et al. |
| 2017/0141300 A1 | 5/2017 | Trinh et al. |
| 2017/0152277 A1 | 6/2017 | Lim et al. |
| 2017/0350012 A1 | 12/2017 | Moon et al. |

FOREIGN PATENT DOCUMENTS

| | | |
|---|---|---|
| KR | 10-0465838 B1 | 1/2005 |
| KR | 10-0505611 B1 | 4/2006 |
| KR | 10-2006-0101965 A | 9/2006 |
| KR | 10-0663341 B1 | 1/2007 |
| KR | 10-0936490 B1 | 1/2010 |
| KR | 10-2011-0008398 A | 1/2011 |

OTHER PUBLICATIONS

Kukli, Kaupo et al. "Niobium Oxide Thin Films Grown by Atomic Layer Epitaxy." *Chemical Vapor Deposition* 4:2 (1998): 29-34.

Wakai, Yoko et al. "Promotional Effect of Iron for the Nitridation of Niobium Oxide to Niobium Nitride." *Topics in Catalysis* 52 (2009): 1517-1524.

Office Action for corresponding U.S. Appl. No. 16/273,603, dated Apr. 2, 2020.

Office Action for corresponding U.S. Appl. No. 16/273,603, dated Aug. 7, 2020.

Advisory Action for corresponding U.S. Appl. No. 16/273,603, dated Oct. 21, 2020.

Notice of Allowance for corresponding U.S. Appl. No. 16/273,603, dated Nov. 27, 2020.

Office Action for corresponding Indian Patent Application No. 201944019638, dated Jun. 24, 2021.

Notice of Allowance for corresponding Singaporean Patent Application No. 10201904336S, dated Jun. 29, 2021.

* cited by examiner

SEMICONDUCTOR DEVICES AND METHOD OF MANUFACTURING THE SAME

CROSS-REFERENCE TO RELATED APPLICATION

The present application is a continuation of and claims priority under 35 U.S.C. § 120 to U.S. patent application Ser. No. 16/273,603, filed on Feb. 12, 2019, which claims priority under 35 U.S.C. § 119 to Korean Patent Application No. 10-2018-0057438, filed on May 18, 2018, in the Korean Intellectual Property Office, the disclosure of which is incorporated herein in its entirety by reference.

BACKGROUND

The inventive concepts relate to a semiconductor device and a method of manufacturing the same, and more particularly, to a semiconductor device including a capacitor structure and a method of manufacturing the same.

Downscaling of semiconductor devices also reduces the sizes of capacitor structures of DRAM devices. However, even if the size of a capacitor structure is reduced, a capacitance demanded by a unit cell of a DRAM device is unchanged. Therefore, a metal-insulator-metal (MIM) capacitor employing a high-k dielectric material having a high dielectric constant and a metal electrode has been proposed.

SUMMARY

The inventive concepts provide a semiconductor device including a capacitor structure having a high capacitance and a method of manufacturing the same.

According to an aspect of the inventive concepts, there is provided a method of manufacturing a semiconductor device, the method including forming a preliminary lower electrode layer including a niobium oxide on a substrate; converting at least a portion of the preliminary lower electrode layer to a first lower electrode layer comprising a niobium nitride by performing a nitridation process on the preliminary lower electrode layer; forming a dielectric layer on the first lower electrode layer; and forming an upper electrode on the dielectric layer.

According to another aspect of the inventive concepts, there is provided a method of manufacturing a semiconductor device, the method including forming a mold layer having an opening on a substrate; forming a preliminary lower electrode layer, which covers an inner wall of the opening and includes a niobium oxide, on the mold layer; converting at least a portion of the preliminary lower electrode layer to a first lower electrode layer comprising a niobium nitride by performing a nitridation process on the preliminary lower electrode layer; forming a dielectric layer on the first lower electrode layer; and forming an upper electrode layer on the dielectric layer.

According to another aspect of the inventive concepts, there is provided a method of manufacturing a semiconductor device, the method including forming a preliminary lower electrode layer including a niobium oxide on a substrate; converting at least a portion of the preliminary lower electrode layer to a first lower electrode layer comprising a niobium nitride by performing a plasma nitridation process on the preliminary lower electrode layer; forming a dielectric layer including a hafnium oxide on the first lower electrode layer; and forming an upper electrode on the dielectric layer.

According to another aspect of the inventive concepts, there is provided a semiconductor device including a contact structure on a substrate; a lower electrode structure on the contact structure and including a first lower electrode layer, which contains a niobium nitride, and a second lower electrode layer, surrounded by the first lower electrode layer and contains niobium oxide; a dielectric layer on the lower electrode structure and including a hafnium oxide having a tetragonal crystalline phase; and an upper electrode on the dielectric layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EXAMPLE EMBODIMENTS

Figure 1:
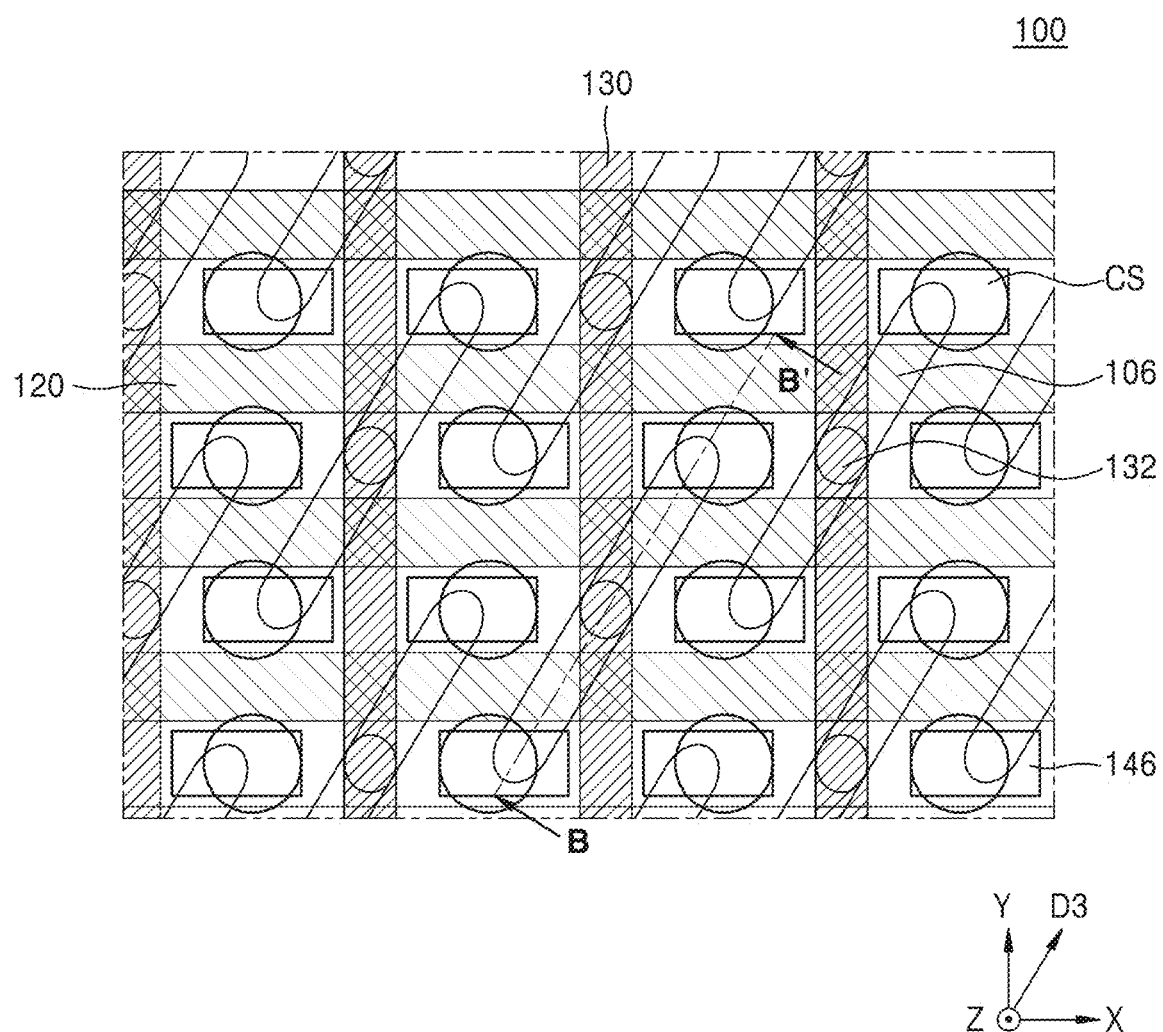
FIG. 1 is a layout diagram illustrating a semiconductor device according to an example embodiment.
Figure 2:
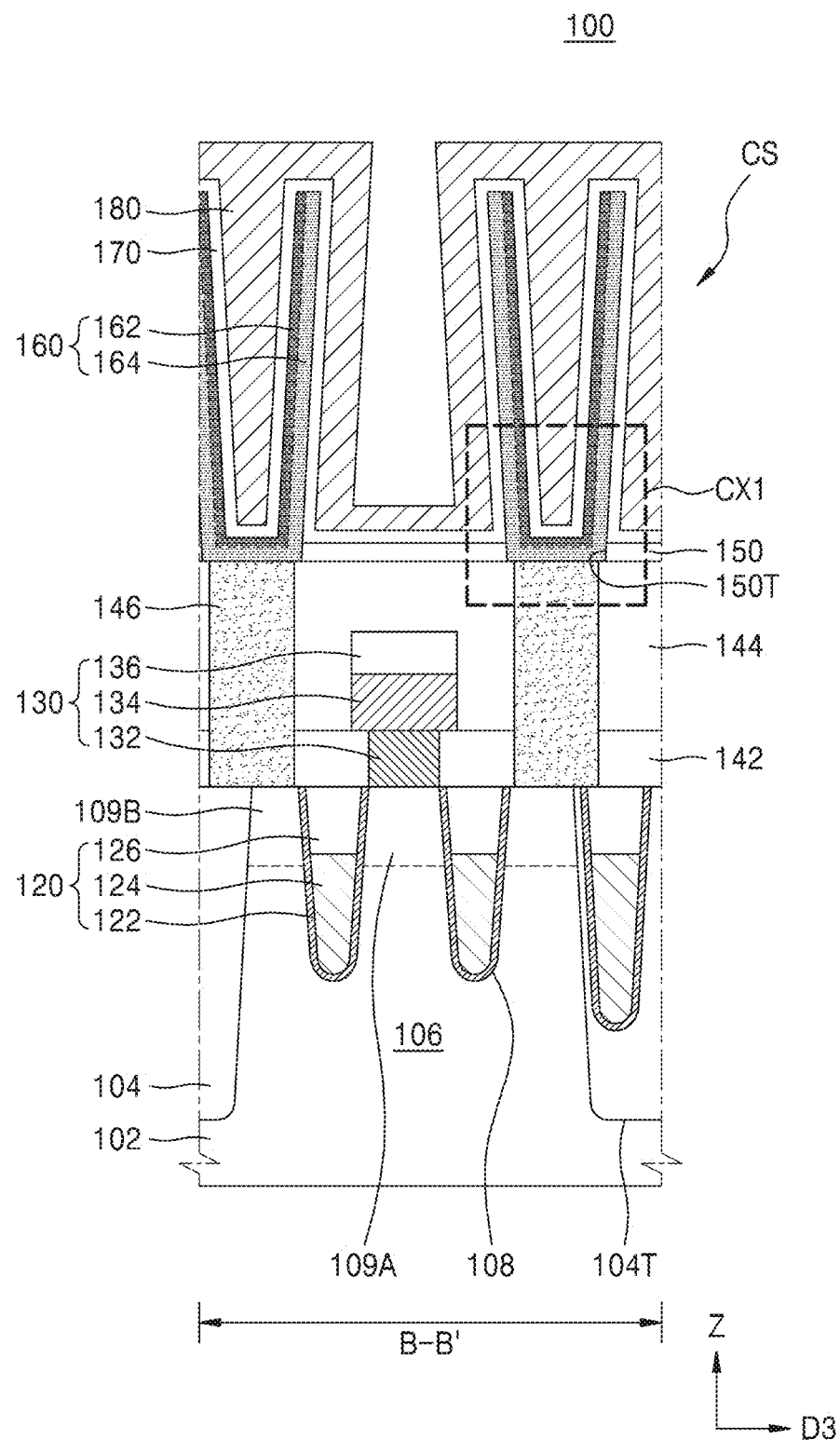
FIG. 2 is a cross-sectional view taken along line B-B' of FIG. 1.

FIG. 1 is a layout diagram illustrating a semiconductor device 100 according to an example embodiment. FIG. 2 is a cross-sectional view taken along line B-B' of FIG. 1, and FIG. 3 is an enlarged view of a region CX1 of FIG. 2.

Figure 3:
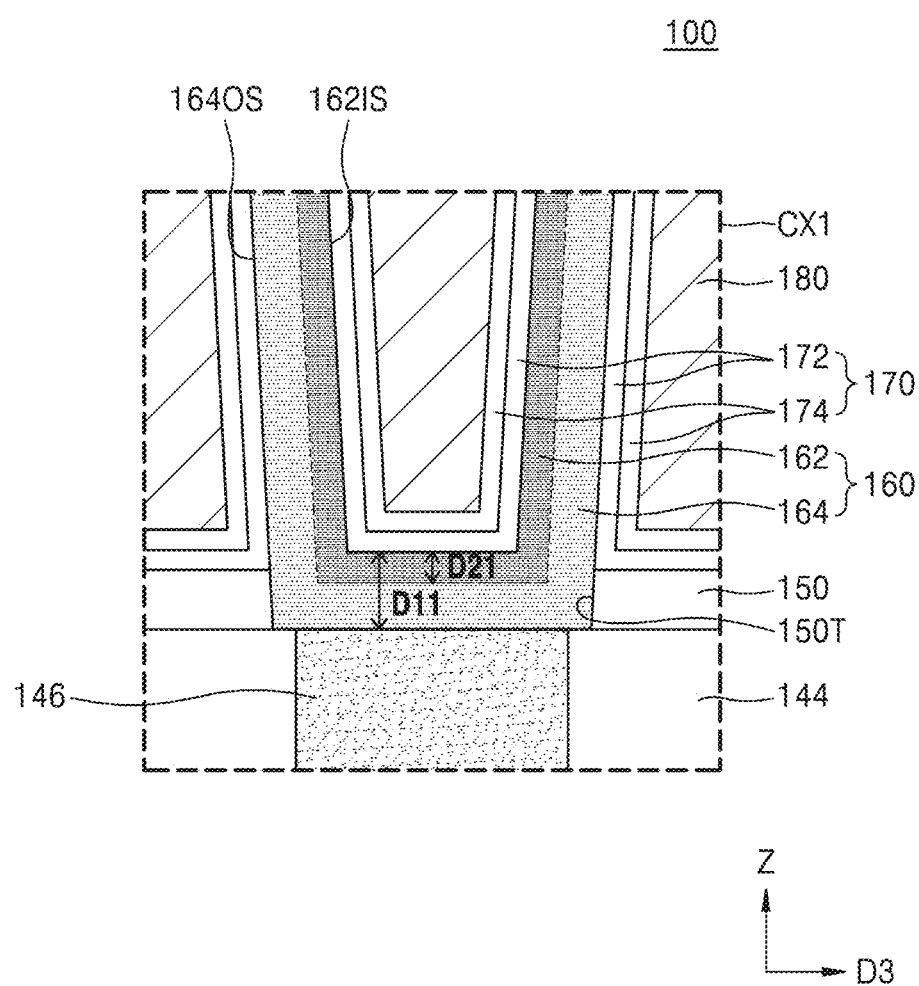
FIG. 3 is an enlarged view of a region CX1 of FIG. 2.

Referring to FIGS. 1 to 3, a substrate 102 may include an active region 106 defined by a device isolation layer 104. According to example embodiments, the substrate 102 may include a semiconductor material like Si, Ge, or SiGe, SiC, GaAs, InAs, or InP. According to example embodiments, the substrate 102 may include a conductive region, e.g., a well doped with an impurity or a structure doped with an impurity.

The device isolation layer 104 may have a shallow trench isolation (STI) structure. For example, the device isolation layer 104 may include an insulating material filling a device isolating trench 104T formed in the substrate 102. The insulating material may include fluoride silicate glass (FSG), undoped silicate glass (USG), borophosphosilicate glass (BPSG), phosphor-silicate glass (PSG), flowable oxide (FOX), plasma enhanced tetra-ethyl-ortho-silicate (PETEOS), or tonen silazane (TOSZ), but is not limited thereto.

The active region 106 may have a relatively long island-like shape having a short axis and a long axis. As shown in FIG. 1, the long axis of the active region 106 may be arranged in a direction D3 parallel to the top surface of the substrate 102. According to example embodiments, the active region 106 may be doped with a P-type impurity or an N-type impurity.

The substrate 102 may further include a gate line trench 108 extending in an X direction parallel to the top surface of the substrate 102. The gate line trench 108 intersects with the active region 106 and may be formed to a certain depth from the top surface of the substrate 102. A portion of the gate line trench 108 may extend into the device isolation layer 104, and the portion of the gate line trench 108 in the device isolation layer 104 may have a bottom surface at a level lower than a portion of the gate line trench 108 formed in the active region 106.

A first source/drain region 109A and a second source/drain region 109B may be in upper portions of the active region 106 on both sides of the gate line trench 108. The first source/drain region 109A and the second source/drain region 109B may be impurity regions doped with an impurity having a conductivity type different from that of the impurity which the active region 106 is doped with. The first source/drain region 109A and the second source/drain region 109B may be doped with an N-type impurity or a P-type impurity.

A gate structure 120 may be in the gate line trench 108. The gate structure 120 may include a gate insulation layer 122, a gate electrode 124 and/or a gate capping layer 126 that are sequentially formed on an inner wall of the gate line trench 108.

The gate insulation layer 122 may be conformably formed on the inner wall of the gate line trench 108 to a certain thickness. The gate insulation layer 122 may include at least one selected from among a silicon oxide, a silicon nitride, a silicon oxynitride, an oxide/nitride/oxide (ONO), or a high-k material having a dielectric constant higher than that of the silicon oxide. For example, the gate insulation layer 122 may have a dielectric constant from about 10 to about 25. In some embodiments, the gate insulation layer 122 may include $HfO_2$, $ZrO_2$, $Al_2O_3$, $HfAlO_3$, $Ta_2O_3$, $TiO_2$, or a combination thereof, but is not limited thereto.

The gate electrode 124 may be formed on the gate insulation layer 122 to fill the gate line trench 108 from the bottom of the gate line trench 108 to a certain height. The gate electrode 124 may include a work function control layer (not shown) on the gate insulation layer 122 and a buried metal layer (not shown) filling the bottom of the gate line trench 108 on the work function control layer. For example, the work function control layer may include a metal, a metal nitride, or a metal carbide, e.g., Ti, TiN, TiAlN, TiAlC, TiAlCN, TiSiCN, Ta, TaN, TaAlN, TaAlCN, TaSiCN, etc., and the buried metal layer may include at least one of W, WN, TiN, and TaN.

The gate capping layer 126 on the gate electrode 124 may fill the remaining portion of the gate line trench 108. For example, the gate capping layer 126 may include at least one of a silicon oxide, a silicon oxynitride, and a silicon nitride.

A bit line structure 130 may be on the first source/drain region 109A, which extends in a Y direction that is parallel to the top surface of the substrate 102 perpendicular to the X direction. The bit line structure 130 may include a bit line contact 132, a bit line 134, and/or a bit line capping layer 136 that are sequentially stacked on the substrate 102. For example, the bit line contact 132 may include polysilicon and the bit line 134 may include a metal. The bit line capping layer 136 may include an insulating material such as a silicon nitride or a silicon oxynitride. FIG. 2 shows that the bit line contact 132 is formed to have a bottom surface at the same level as the top surface of the substrate 102. Alternatively, a recess (not shown) may be formed to a certain depth from the top surface of the substrate 102 and the bit line contact 132 may extend into the recess. Therefore, the bottom surface of the bit line contact 132 may be at a level lower than the top surface of the substrate 102.

Selectively, a bit line intermediate layer (not shown) may be between the bit line contact 132 and the bit line 134. The bit line intermediate layer may include a metal silicide such as tungsten silicide or a metal nitride such as tungsten nitride. Bit line spacers (not shown) may be further formed on a sidewall of the bit line structure 130. The bit line spacers may have a single layer structure or a multilayer structure including an insulating material such as a silicon oxide, a silicon oxynitride, or a silicon nitride. Furthermore, the bit line spacers may further include an air space (not shown).

A first interlayer insulation layer 142 may be on the substrate 102, and the bit line contact 132 may penetrate through the first interlayer insulation layer 142 and be connected to the first source/drain region 109A. The bit line 134 and the bit line capping layer 136 may be on the first interlayer insulation layer 142. A second interlayer insulation layer 144 may be on the first interlayer insulation layer 142 and cover side surfaces and top surfaces of the bit line 134 and the bit line capping layer 136.

A contact structure 146 may be on the second source/drain region 109B. First and second interlayer insulation layers 142 and 144 may surround the sidewalls of the contact structure 146. According to example embodiments, the contact structure 146 may include a lower contact pattern (not shown), a metal silicide layer (not shown), and/or an upper contact pattern (not shown), which are sequentially stacked on the substrate 102, and a barrier layer (not shown) surrounding side surfaces and a bottom surface of the upper contact pattern. According to example embodiments, the lower contact pattern may include polysilicon, and the upper contact pattern may include a metal material. The barrier layer may include a metal nitride having conductivity.

A capacitor structure CS may be on the second interlayer insulation layer 144. The capacitor structure CS may include a lower electrode structure 160 electrically connected to the contact structure 146, a dielectric layer structure 170 conformally covering the lower electrode structure 160, and/or an upper electrode 180 on the dielectric layer structure 170. An etch stop layer 150 including an opening 150T may be on the second interlayer insulation layer 144, and a bottom portion of the lower electrode structure 160 may be within the opening 150T of the etch stop layer 150.

FIG. 1 shows an example in which capacitor structures CS are repeatedly arranged in the X and Y directions on contact structures 146 that are repeatedly arranged in the X and Y directions. However, unlike the structure shown in FIG. 1, the capacitor structures CS may be arranged in a hexagonal shape (e.g., a honeycomb structure) on the contact structures 146 that are repeatedly arranged in the X and Y directions. In this case, landing pads (not shown) may be further formed between the contact structures 146 and the capacitor structures CS.

The lower electrode structure 160 may be formed on the contact structure 146 and have a cylindrical shape or a cup-like shape with a closed bottom. The lower electrode structure 160 may include a first lower electrode layer 162 and/or a second lower electrode layer 164 surrounding sidewalls and a bottom surface of the first lower electrode layer 162.

According to example embodiments, the first lower electrode layer 162 may include a niobium nitride. For example, the first lower electrode layer 162 may have a composition of $NbN_x$ (0.5≤x≤1). According to other example embodiments, the first lower electrode layer 162 may include a niobium nitride including oxygen at a certain concentration.

According to example embodiments, the second lower electrode layer 164 may include a niobium oxide. For example, the second lower electrode layer 164 may have a composition of $NbO_y$ (0.5≤y≤2.5). According to other example embodiments, the second lower electrode layer 164 may include a niobium oxide including nitrogen at a certain concentration.

In an example manufacturing process, a preliminary lower electrode layer 160P including a niobium oxide may be first formed on a mold layer 210 including an opening 210H (refer to FIG. 15), and then a nitridation process may be performed on a surface of the preliminary lower electrode layer 160P, thereby transforming or converting the niobium oxide in a portion from the surface of the preliminary lower electrode layer 160P into a niobium nitride. The portion of the preliminary lower electrode layer 160P including the transformed niobium nitride may be referred to as the first lower electrode layer 162, whereas the remaining portion of the preliminary lower electrode layer 160P including a niobium oxide may be referred to as the second lower electrode layer 164.

For example, the lower electrode structure 160 may have a first thickness D11 in a third direction (Z direction) perpendicular to the top surface of the substrate 102, and the first thickness may be from about 10 Å to about 100 Å, but is not limited thereto. The first lower electrode layer 162 may have a second thickness D21 in the third direction (Z direction), and the second thickness D21 may be from about 5% to about 50% of the first thickness D11, but is not limited thereto. For example, the second thickness D21 may be appropriately selected depending on process conditions including a type of the nitridation process, a plasma application condition, a type of a nitrogen source, and a process temperature.

A nitrogen concentration profile of the lower electrode structure 160 in the thickness-wise direction will be described below with reference to FIG. 27.

Figure 27:
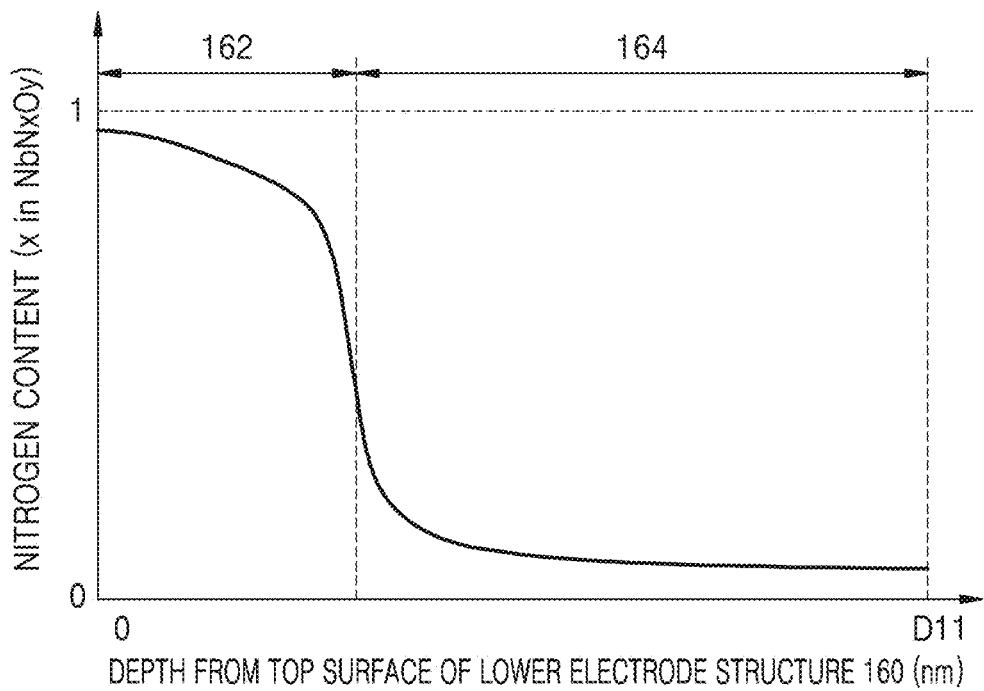
FIG. 27 is a graph schematically showing nitrogen contents according to depths from the top surface of a lower electrode structure.

FIG. 27 is a graph schematically showing nitrogen contents according to depths from the top surface of the lower electrode structure 160. In FIG. 27, to indicate both the first lower electrode layer 162 and the second lower electrode layer 164, nitrogen contents (x) in a niobium oxynitride ($NbN_xO_y$) (0<x<1, 0<y<2) are indicated by the y-axis, and depths from the top surface of the lower electrode structure 160 are indicated by the x-axis.

Referring to FIG. 27, the content of nitrogen may be reduced in gradient from a portion of the first lower electrode layer 162 close to the top surface of the lower electrode structure 160 to a portion of the second lower electrode layer 164 close to the bottom surface of the lower electrode structure 160. For example, when a nitridation process is performed on an exposed surface of the preliminary lower electrode layer 160P including a niobium oxide, relatively dense nitrogen may be filed up in the first lower electrode layer 164, that is, a portion of the preliminary lower electrode layer 160P between the top surface of the preliminary lower electrode layer 160P and the depth D21, and thus nitrogen may be substituted for oxygen. Therefore, the concentration of nitrogen atoms in the first lower electrode layer 162 may be higher than the concentration of nitrogen atoms in the second lower electrode layer 164. Meanwhile, FIG. 27 schematically shows an example of distribution of nitrogen concentrations that may be realized in the lower electrode structure 160 for convenience of explanation, and the inventive concepts are not limited thereto.

Referring back to FIGS. 1 to 3, the dielectric layer structure 170 may be on the lower electrode structure 160 and the etch stop layer 150. The dielectric layer structure 170 may have a stacked structure including a first dielectric layer 172 and/or a second dielectric layer 174. The first dielectric layer 172 may contact the lower electrode structure 160 and may include a first dielectric material. The second dielectric layer 174 may be on the first dielectric layer 172 and contact the upper electrode 180. The second dielectric layer 174 may include a second dielectric material different from the first dielectric material.

As shown in FIG. 3, the first dielectric layer 172 may be entirely on inner surfaces 162IS of the first lower electrode layer 162. Furthermore, the first dielectric layer 172 may also be entirely on outer surfaces 164OS of the second lower electrode layer 164.

According to example embodiments, the first dielectric layer 172 may include a metal oxide having a higher dielectric constant than that of the second dielectric layer 174. For example, the first dielectric layer 172 may include a hafnium oxide having a tetragonal crystalline phase. For example, the dielectric layer structure 170 may exhibit a peak of 30.48°±0.2° due to the {101} plane of the tetragonal crystal structure of the first dielectric layer 172 in an X-ray diffraction analysis (refer to FIG. 29).

As the first dielectric layer 172 is formed to contact the first lower electrode layer 162 including a niobium nitride, the first dielectric layer 172 may be formed to have a tetragonal crystalline phase. It is known that a hafnium oxide having a tetragonal crystalline phase has a dielectric constant of about 30% higher than that of a hafnium oxide having a monoclinic crystalline phase. Accordingly, as the first dielectric layer 172 includes a hafnium oxide having a tetragonal crystalline phase, the total dielectric constant of the dielectric layer structure 170 may be relatively high.

The second dielectric layer 174 may be on the first dielectric layer 172 to cover the lower electrode structure 160. The second dielectric layer 174 may include a second dielectric material different from the first dielectric material, and the second dielectric material may include at least one from among a zirconium oxide, an aluminum oxide, a silicon oxide, a titanium oxide, an yttrium oxide, a scandium oxide, and a lanthanum oxide.

According to other example embodiments, the dielectric layer structure 170 may include the first dielectric layer 172, the second dielectric layer 174, and/or a third dielectric layer (not shown) that are sequentially stacked on the lower electrode structure 160. The third dielectric layer may include a third dielectric material different from the second dielectric material, and the third dielectric material may include at least one from among a zirconium oxide, an aluminum oxide, a silicon oxide, a titanium oxide, an yttrium oxide, a scandium oxide, a hafnium oxide, and a lanthanum oxide.

The upper electrode 180 may include at least one selected from among doped polysilicon, metals such as ruthenium (Ru), titanium (Ti), tantalum (Ta), and tungsten (W), conductive metal nitrides such as a titanium nitride (TiN), a tantalum nitride (TaN), a tungsten nitride (WN), a niobium nitride (NbN), and conductive metal oxides such as an iridium oxide.

According to the semiconductor device 100 described above, the first dielectric layer 172 may be disposed on the top surfaces of the first lower electrode layer 162 including a niobium nitride and the second lower electrode layer 164 including a niobium oxide, and the first dielectric layer 172 may include a hafnium oxide having a crystalline phase. Therefore, the capacitor structure CS may have a high dielectric constant.

Generally, when a lower electrode including a niobium nitride is formed, a deposition process using a metal organic precursor including niobium is performed. In such a process, organic impurities like carbon contained in the metal organic precursor including niobium may be condensed or may not be removed, and defects may be formed in the lower electrode due to such organic impurities. However, in the semiconductor device 100 according to the above-described embodiment, the preliminary lower electrode layer 160P including a niobium oxide may be formed first, and then a nitridation process may be performed on the preliminary lower electrode layer 160P to transform or convert a portion of the niobium oxide into a niobium nitride. Therefore, organic impurities like carbon may be effectively removed by an oxidizing agent or an oxidizing atmosphere used in an operation for forming a niobium oxide, and the lower electrode structure 160 may have excellent film quality.

Figure 29:
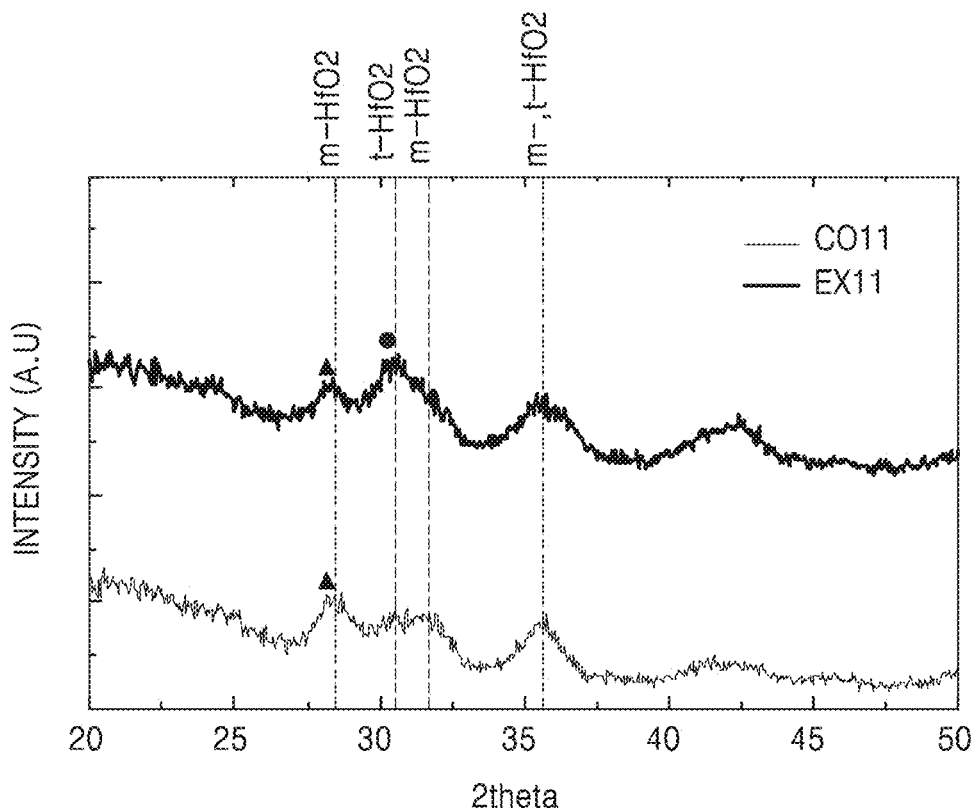
FIG. 29 shows graphs of X-ray diffraction analysis of capacitor structures according to experimental examples and comparative example.
Figure 30:
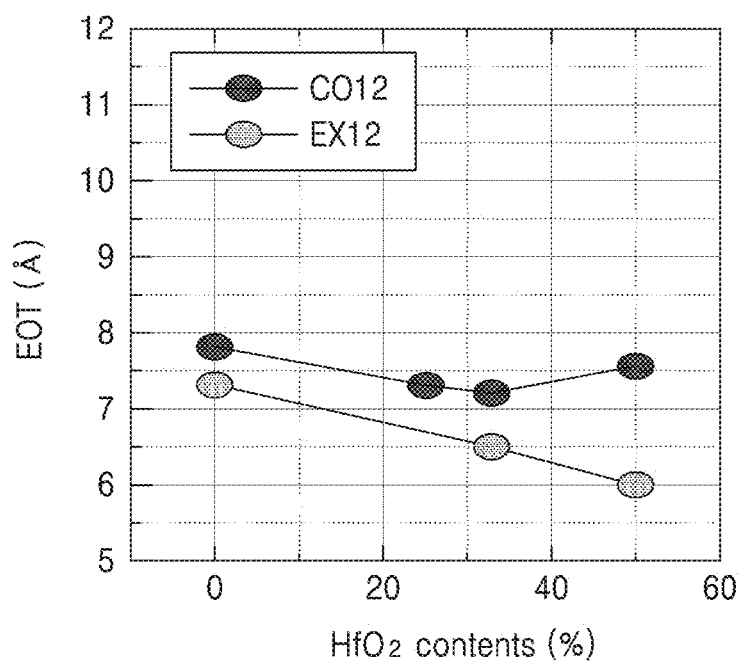
FIG. 30 is a graph showing the equivalent oxide thicknesses of a capacitor structures according to experimental examples and comparative example.

Hereinafter, referring to FIGS. 29 and 30, X-ray diffraction analysis graphs and an equivalent oxide thickness of capacitor structures according to example embodiments will be described in comparison with a capacitor structure according to comparative examples. In FIGS. 29 and 30, X-ray diffraction analysis and equivalent oxide thickness measurements were performed on capacitor structures according to experimental example 1 EX11 and experimental example 2 EX12 including niobium nitride as lower electrodes and capacitor structures according to comparative example 1 CO11 and comparative example 2 CO12 including titanium nitride as lower electrodes.

Referring to FIG. 29, in the comparative example 1 CO11, a peak ▲ due to the (−111) plane of a monoclinic crystalline phase at about 28.30° was observed, but no peak due to the (101) plane of a tetragonal crystalline phase at about 30.48° was observed. On the other hand, in the experimental example 1 EX11, a peak ● due to the (101) plane of a tetragonal crystalline phase at about 30.48° was observed. In other words, it was observed that a hafnium oxide on a titanium nitride was preferentially oriented to have a monoclinic crystalline phase, whereas a hafnium oxide on a niobium nitride, as in the experimental example 1 EX11, was preferentially oriented to have a tetragonal crystalline phase.

Table 1 below shows the interfacial energies of a hafnium oxide (m-HfO$_2$) with a monoclinic crystalline phase and a hafnium oxide (t-HfO$_2$) with a tetragonal crystalline phase on a niobium nitride and a titanium nitride, calculated from simulations.

TABLE 1

| Underlayer | m-HfO$_2$ Interfacial Energy (meV/Å$^2$) | t-HfO$_2$ Interfacial Energy (meV/Å$^2$) | Interfacial Energy Difference (meV/Å$^2$) |
|---|---|---|---|
| Niobium Nitride | +420.5 | +286.6 | −133.9 |
| Titanium Nitride | +483.9 | +472.1 | −11.8 |

Referring to Table 1, the interfacial energy between a surface of the niobium nitride and a surface of the hafnium oxide with a tetragonal structure may be significantly less than the interfacial energy between a surface of the niobium nitride and a surface of the hafnium oxide with a monoclinic structure. Therefore, it may be assumed that the hafnium oxide on the surface of niobium nitride will be crystallized to be preferentially oriented to have a tetragonal crystalline phase, and a result of the simulation is consistent with a result of an X-ray diffraction analysis shown in FIG. 29.

Referring to FIG. 30, the experimental example 2 EX12 exhibited a smaller equivalent oxide thickness than that of the comparative example 2 CO12. That is, it may be observed that, at a same hafnium oxide content, the experimental example 2 EX12 may have a higher capacitance than the comparative example 2 CO12. This may be presumably because the hafnium oxide in the experimental example 2 EX12 is preferentially oriented to have a tetragonal crystalline phase, as described above with reference to FIG. 29.

Figure 4:
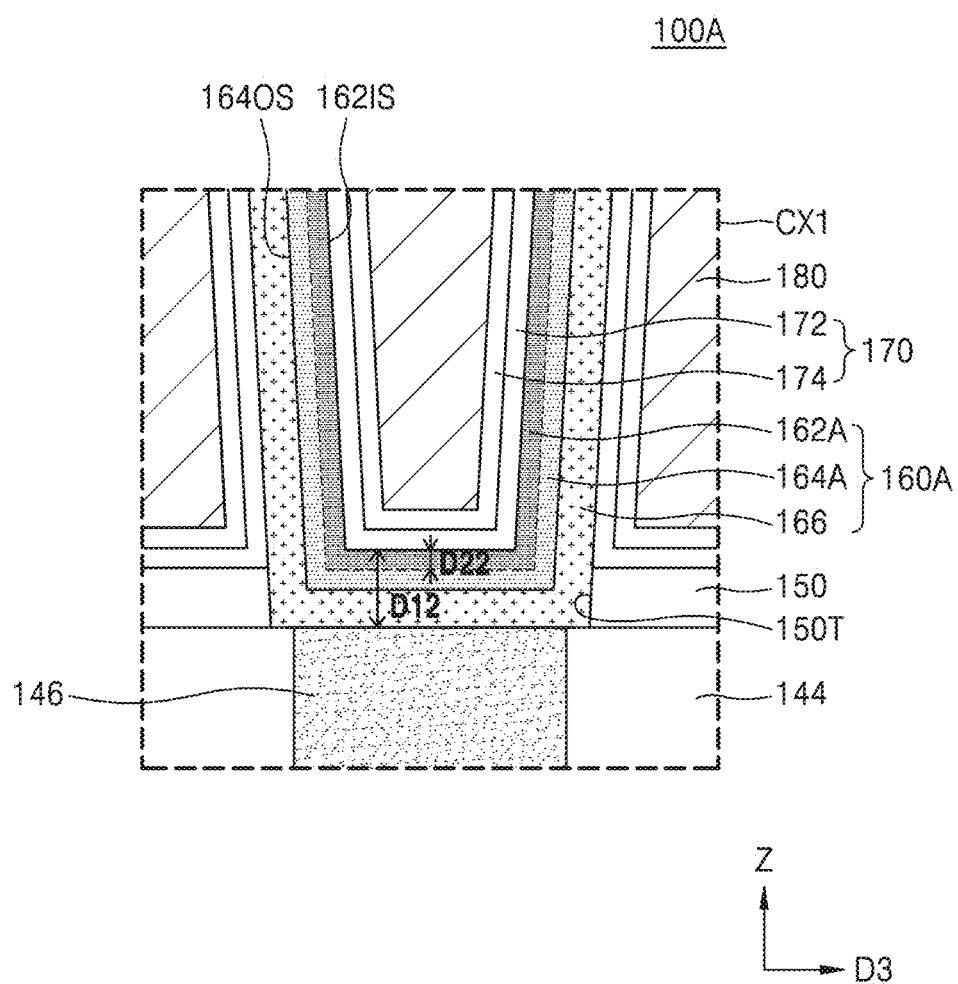
FIG. 4 is a cross-sectional view of a semiconductor device according to an example embodiment.

FIG. 4 is a cross-sectional view of a semiconductor device 100A according to an example embodiment. FIG. 4 is a cross-sectional view of a portion corresponding to the region CX1 in FIG. 2. In FIG. 4, reference numerals same as those in FIGS. 1 to 3 denote the same components.

Referring to FIG. 4, a lower electrode structure 160A may include a first lower electrode layer 162A, a second lower electrode layer 164A, and/or a lower base layer 166. The lower base layer 166 may surround the outer wall 164OS and the bottom surface of the second lower electrode layer 164A, and the bottom surface of the lower base layer 166 may be disposed on the top surface of the contact structure 146.

According to example embodiments, the lower base layer 166 may include at least one selected from among doped polysilicon, metals such as ruthenium (Ru), titanium (Ti), tantalum (Ta), and tungsten (W), conductive metal nitrides such as a titanium nitride (TiN), a tantalum nitride (TaN), and a tungsten nitride (WN), and conductive metal oxides such as an iridium oxide.

According to example embodiments, a first thickness D12 of the lower electrode structure 160A in the third direction (Z direction) perpendicular to the top surface of the substrate 102 (see FIG. 2) may be from about 10 Å to about 100 Å, but is not limited thereto. The first lower electrode layer 162A may have a second thickness D22 in the third direction (Z direction), and the second thickness D22 may be from about 5% to about 30% of the first thickness D12, but is not limited thereto.

In an example fabrication process, the lower base layer 166 may be formed on the mold layer 210 having opening 210H (see FIG. 15), and the preliminary lower electrode layer 160P covering the inner wall of the opening 210H and including niobium oxide may be formed on the lower base layer 166. A nitridation process may be performed on a surface of the preliminary lower electrode layer 160P, thereby transforming or converting a niobium oxide in a portion of the preliminary lower electrode layer 160P from the surface thereof to a niobium nitride. The portion of the preliminary lower electrode layer 160P including the transformed niobium nitride may be referred to as the first lower electrode layer 162A, whereas the remaining portion of the preliminary lower electrode layer 160P including a niobium oxide may be referred to as the second lower electrode layer 164A.

Figure 5:
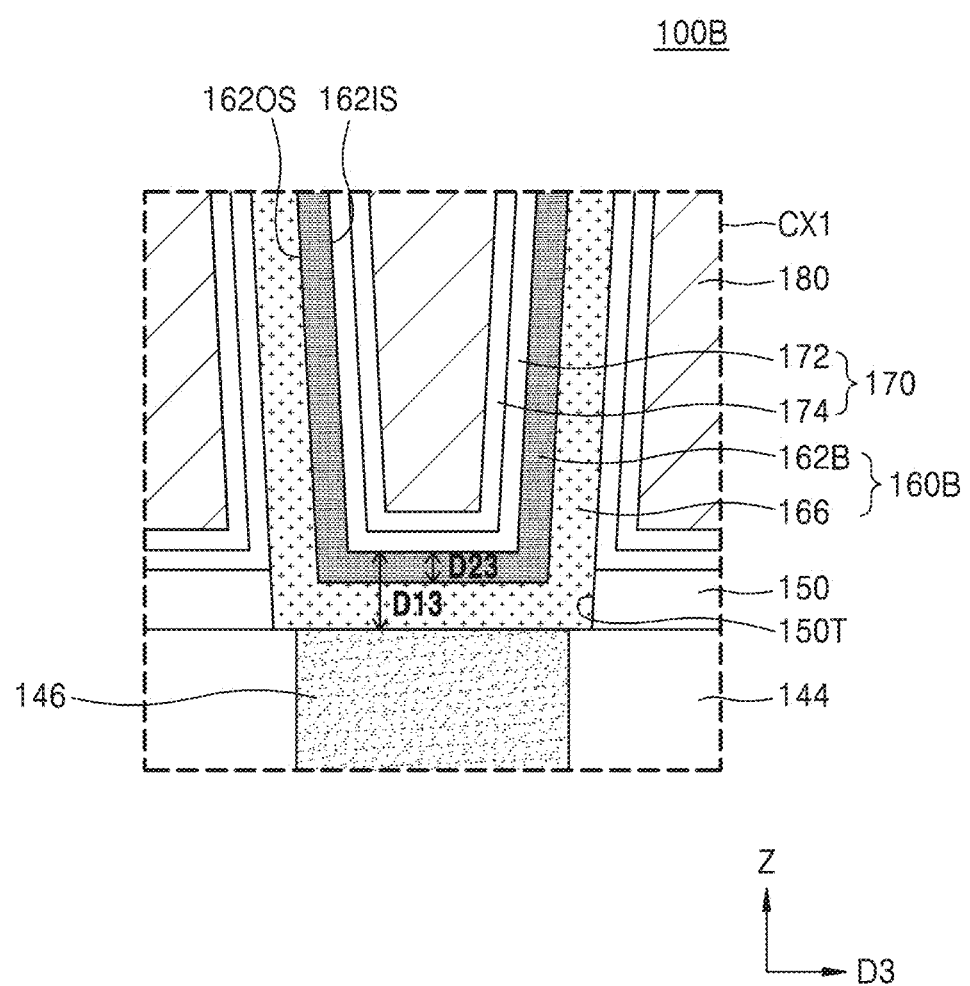
FIG. 5 is a cross-sectional view of a semiconductor device according to an example embodiment.

FIG. 5 is a cross-sectional view of a semiconductor device 100B according to an example embodiment. FIG. 5 is a cross-sectional view of a portion corresponding to the region CX1 in FIG. 2. In FIG. 5, reference numerals that are the same as those in FIGS. 1 to 4 denote the same components.

Referring to FIG. 5, a lower electrode structure 160B may include a first lower electrode layer 162B and a lower base layer 166.

According to example embodiments, a first thickness D13 of the lower electrode structure 160B in the third direction (Z direction) perpendicular to the top surface of the substrate 102 (see FIG. 2) may be from about 10 Å to about 100 Å, but is not limited thereto. The first lower electrode layer 162B may have a second thickness D23 in the third direction (Z direction), and the second thickness D23 may be from about 5% to about 50% of the first thickness D13, but is not limited thereto.

The inner wall 162IS of the first lower electrode layer 162B may contact the first dielectric layer 172 and an outer wall 162OS of the first lower electrode layer 162B may contact the lower base layer 166.

In an example fabrication process, the lower base layer 166 may be formed on the mold layer 210 having opening 210H (see FIG. 15), and the preliminary lower electrode layer 160P covering the inner wall of the opening 210H and including niobium oxide may be formed on the lower base layer 166. A nitridation process may be performed on a surface of the preliminary lower electrode layer 160P, thereby transforming or converting a niobium oxide within an entire thickness of the preliminary lower electrode layer 160P to a niobium nitride. Accordingly, the preliminary lower electrode layer 160P including the niobium nitride may be referred to as the first lower electrode layer 162B.

Figure 6:
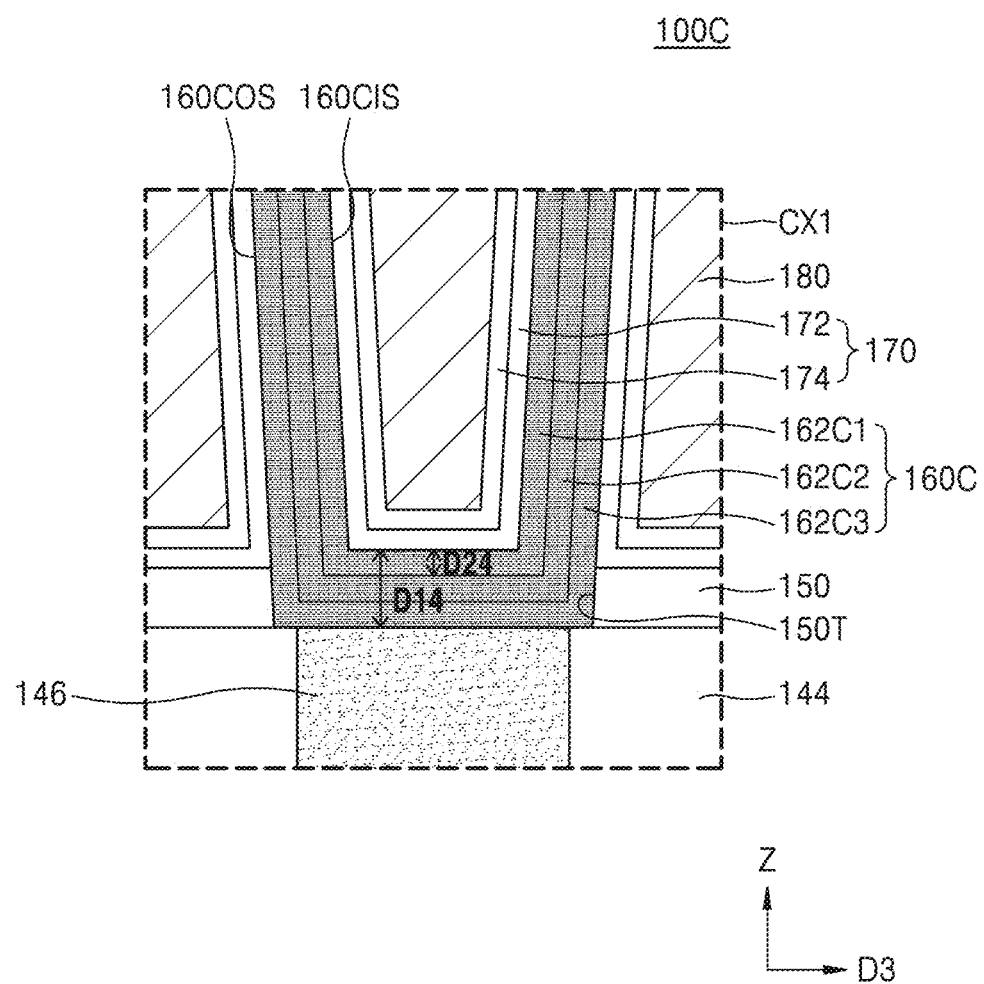
FIG. 6 is a cross-sectional view of a semiconductor device according to an example embodiment.

FIG. 6 is a cross-sectional view of a semiconductor device 100C according to an example embodiment. FIG. 6 is a cross-sectional view of a portion corresponding to the region CX1 in FIG. 2. In FIG. 6, reference numerals that are the same as those in FIGS. 1 to 5 denote the same components.

Referring to FIG. 6, a lower electrode structure 160C may include a first sub-lower electrode layer 162C1, a second sub-lower electrode layer 162C2, and/or a third sub-lower electrode layer 162C3. First to third sub-lower electrode layers 162C1, 162C2, and 162C3 may each include a niobium nitride. An inner wall 160CIS of the lower electrode structure 160C (e.g., an inner wall of the first sub-lower electrode layer 162C1) may contact the first dielectric layer 172 and an outer wall 160COS of the lower electrode structure 160C (e.g., an outer wall of the third sub-lower electrode layer 162C3) may contact the first dielectric layer 172.

According to example embodiments, a first thickness D14 of the lower electrode structure 160C in the third direction (Z direction) perpendicular to the top surface of the substrate 102 (see FIG. 2) may be from about 10 Å to about 100 Å, but is not limited thereto. The first sub-lower electrode layer 162C1 may have a second thickness D24 in the third direction (Z direction), and the second thickness D24 may be from about 20% to about 50% of the first thickness D14, but is not limited thereto.

FIG. 6 shows an example in which the first to third sub-lower electrode layers 162C1, 162C2, and 162C3 that are sequentially stacked constitute the lower electrode structure 160C. Alternatively, two sub-lower electrode layers may be stacked or four or more sub-lower electrode layers may be stacked to constitute the lower electrode structure 160C.

Figure 15:
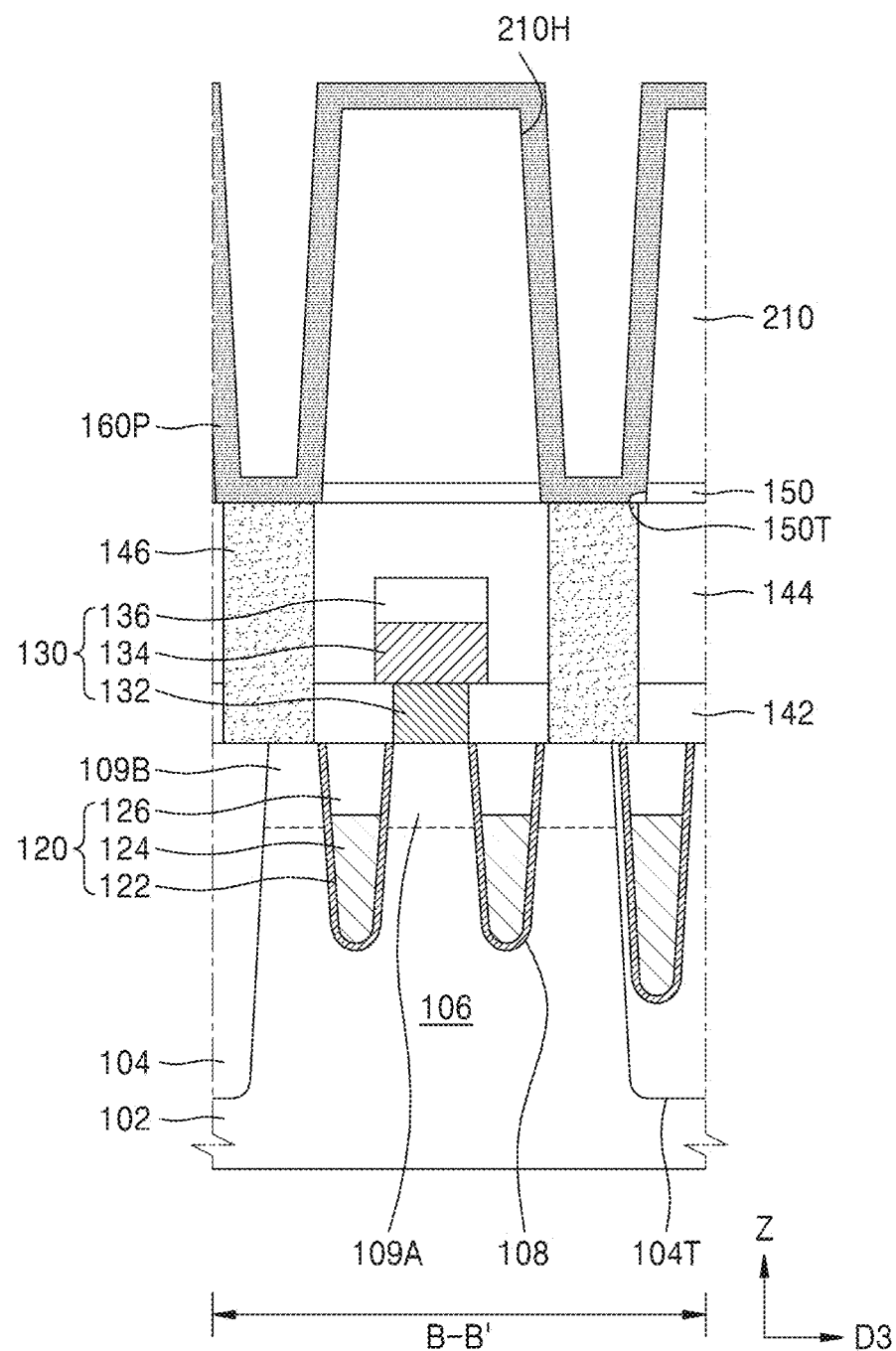

In an example fabrication process, a first preliminary lower electrode layer (not shown) including a niobium oxide may be formed on the mold layer 210 having the opening 210H (see FIG. 15). A nitridation process may be performed on a surface of the first preliminary lower electrode layer to transform or convert a niobium oxide into a niobium nitride throughout the first preliminary lower electrode layer (e.g., within an entire thickness of the preliminary lower electrode layer), thereby forming the third sub-lower electrode layer 162C3. Next, a second preliminary lower electrode layer (not shown) including a niobium oxide may be formed on the third sub-lower electrode layer 162C3, a nitridation process may be performed on a surface of the second preliminary lower electrode layer to transform or convert a niobium oxide to a niobium nitride throughout the second preliminary lower electrode layer, thereby forming the second sub-lower electrode layer 162C2. Next, a third preliminary lower electrode layer (not shown) including a niobium oxide may be formed on the second sub-lower electrode layer 162C2, a nitridation process may be performed on a surface of the third preliminary lower electrode layer to transform or convert a niobium oxide to a niobium nitride throughout the third preliminary lower electrode layer, thereby forming the first sub-lower electrode layer 162C1.

As the lower electrode structure 160C is formed as a stacked structure including the first to third sub-lower electrode layers 162C1, 162C2, and 162C3, the lower electrode structure 160C may include a niobium nitride having a relatively high nitrogen content throughout the thickness thereof.

A nitrogen concentration profile of the lower electrode structure 160C in the thickness-wise direction will be described below with reference to FIG. 28.

Figure 28:
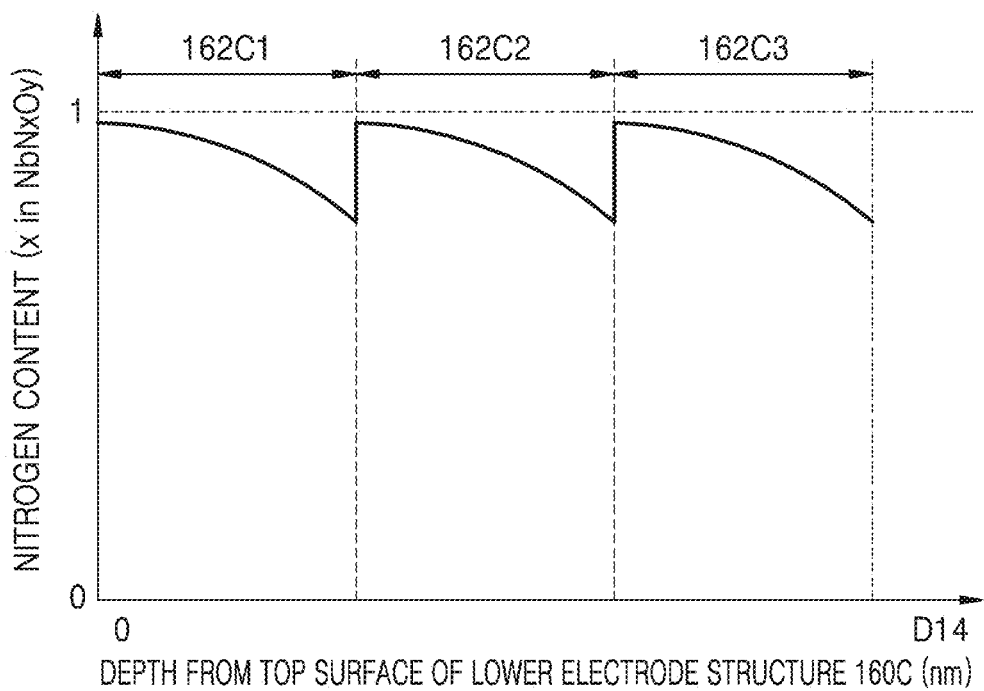
FIG. 28 is a graph schematically showing nitrogen contents according to depths from the top surface of a lower electrode structure.

FIG. 28 is a graph schematically showing nitrogen contents according to depths from the top surface of the lower electrode structure 160C.

Referring to FIG. 28 with FIG. 5, the content of nitrogen may be reduced in gradient from a portion of the first sub-lower electrode layer 162C1 close to the top surface of the lower electrode structure 160C to a portion of the first sub-lower electrode layer 162C1 close to the bottom surface of the lower electrode structure 160C (or close to the second sub-lower electrode layer 162C2). For example, by performing a nitridation process on an exposed surface of a first preliminary lower electrode layer 162P1 including a niobium oxide, relatively dense nitrogen may be filed up in a portion corresponding to the first sub-lower electrode layer 162C1. Also, similar to the concentration profile in the portion of the first sub-lower electrode layer 162C1, relatively dense nitrogen may be filed up in portions corresponding to the second sub-lower electrode layer 162C2 and the third sub-lower electrode layer 162C3.

Meanwhile, FIG. 28 schematically shows an example of distribution of nitrogen concentrations that may be realized in the lower electrode structure 160C for convenience of explanation, and the inventive concepts are not limited thereto.

Figure 7:
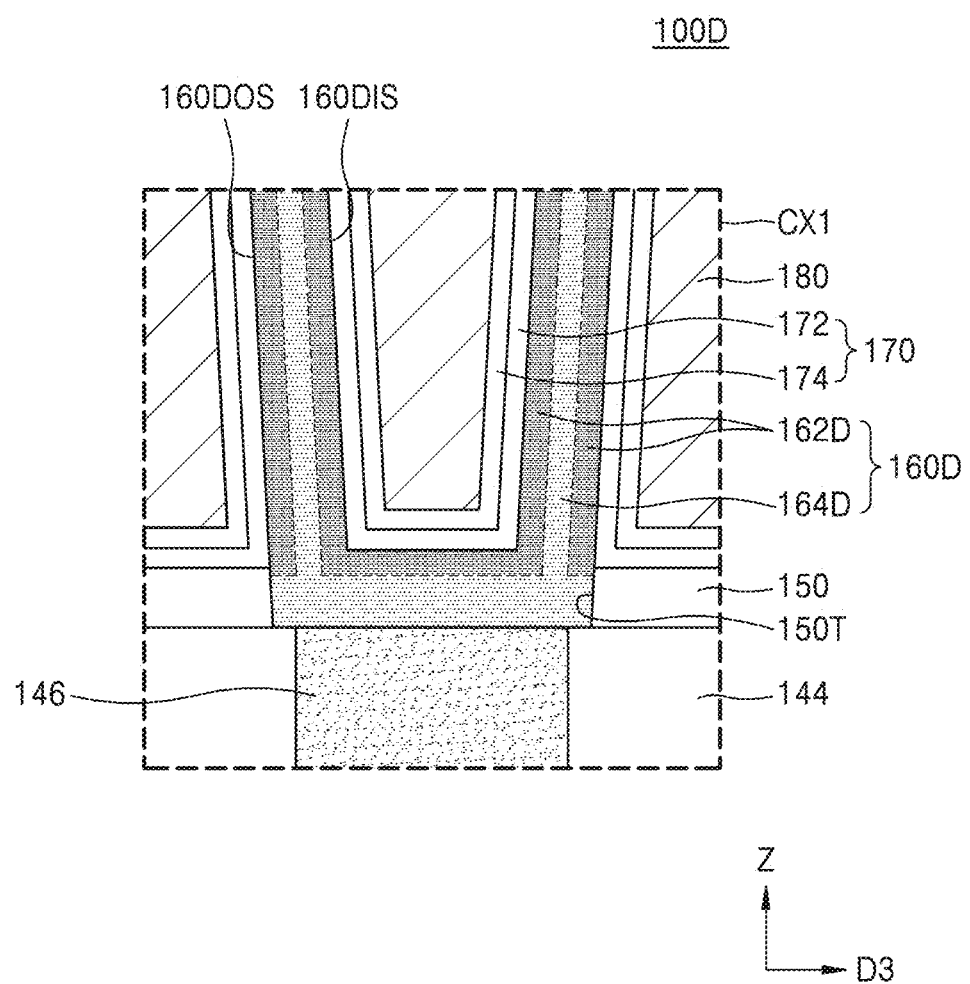
FIG. 7 is a cross-sectional view of a semiconductor device according to an example embodiment.

FIG. 7 is a cross-sectional view of a semiconductor device 100D according to an example embodiment. FIG. 7 is a cross-sectional view of a portion corresponding to the region CX1 in FIG. 2. In FIG. 7, reference numerals that are the same as those in FIGS. 1 to 6 denote the same components.

Referring to FIG. 7, a lower electrode structure 160D may include a first lower electrode layer 162D and a second lower electrode layer 164D. The first lower electrode layer 162D may be surround inner and outer walls of the second lower electrode layer 164D. For example, the first lower electrode layer 162D may be between the second lower electrode layer 164D and the first dielectric layer 172, and thus the first dielectric layer 172 may not contact the second lower electrode layer 164D.

According to example embodiments, an inner wall 160DIS of the lower electrode structure 160D (e.g., a portion of the first lower electrode layer 162D on the inner wall 160DIS portion of the lower electrode structure 160D) may contact the first dielectric layer 172, and an outer wall 160DOS of the lower electrode structure 160D (e.g., a portion of the first lower electrode layer 162D on the outer wall 160DOS of the lower electrode structure 160D) may contact the first dielectric layer 172. The first lower electrode layer 162D including a niobium nitride and the first dielectric layer 172 may contact each other substantially at the entire surface area of the lower electrode structure 160D (e.g., the entire surface area of the lower electrode structure 160D except for a portion of a side wall of the lower electrode structure 160D surrounded by the etch stop layer 150 and the bottom surface of the lower electrode structure 160D contacting the contact structure 146).

In an example fabrication process, the preliminary lower electrode layer 160P including a niobium oxide may be formed on the mold layer 210 having the opening 210H (see FIG. 15). Next, the mold layer 210 is removed and a nitridation process is performed on a surface of the preliminary lower electrode layer 160P to transform or convert a niobium oxide to a niobium nitride in portions of the preliminary lower electrode layer 160P having certain depths from inner and outer sidewalls of the preliminary lower electrode layer 160P. Therefore, the preliminary lower electrode layer 160P including the niobium nitride may be referred to as the first lower electrode layer 162D, whereas the remaining preliminary lower electrode layer 160P may be referred to as the second lower electrode layer 164D.

Figure 8:
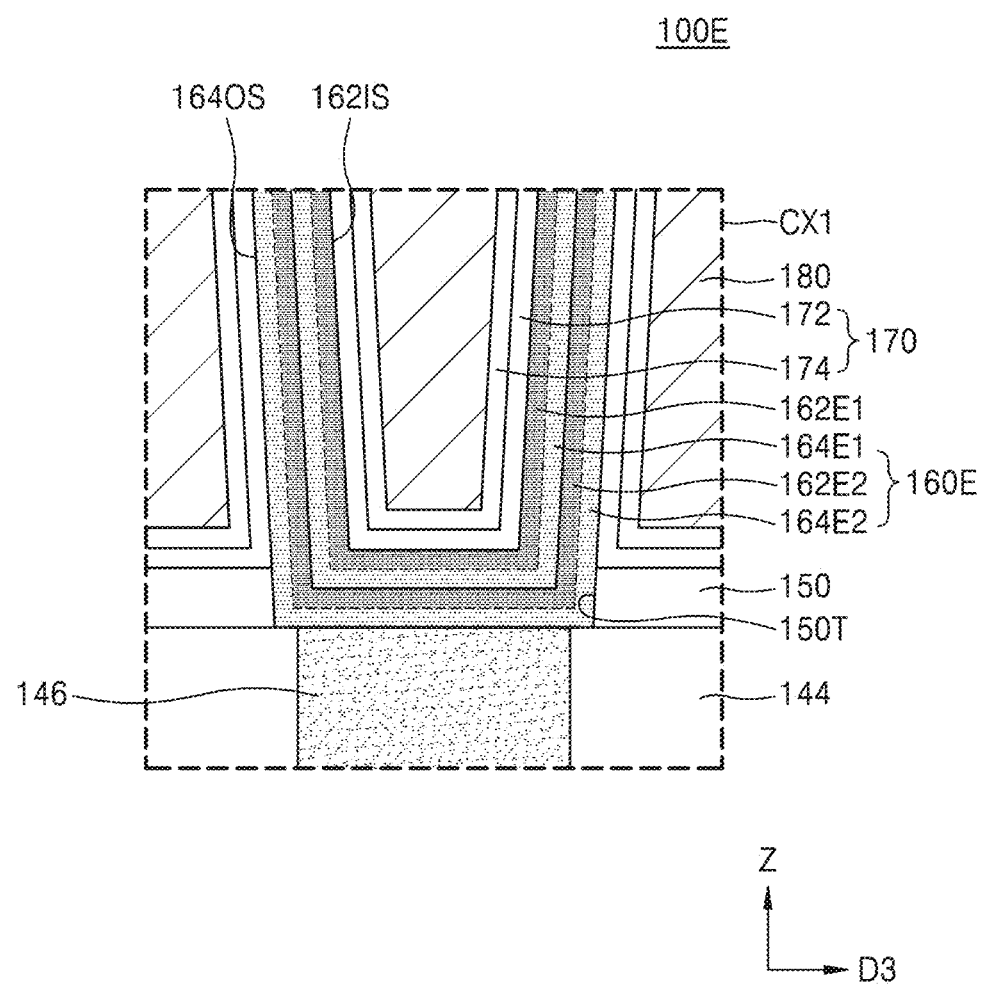
FIG. 8 is a cross-sectional view of a semiconductor device according to an example embodiment.

FIG. 8 is a cross-sectional view of a semiconductor device 100E according to an example embodiment. FIG. 8 is a cross-sectional view of a portion corresponding to the region CX1 in FIG. 2. In FIG. 8, reference numerals that are the same as those in FIGS. 1 to 7 denote the same components.

Referring to FIG. 8, a lower electrode structure 160E may include a first sub-lower electrode layer 162E1, a second sub-lower electrode layer 164E1, a third sub-lower electrode layer 162E2, and/or a fourth sub-lower electrode layer 164E2. First and third sub-lower electrode layers 162E1 and 162E2 may include a niobium nitride, and second and fourth sub-lower electrode layers 164E1 and 164E2 may include a niobium oxide.

In an example fabrication process, a first preliminary lower electrode layer (not shown) including a niobium oxide may be formed on the mold layer 210 having the opening 210H (see FIG. 15). A nitridation process may be performed on a surface of the first preliminary lower electrode layer to transform or convert a niobium oxide into a niobium nitride in a portion of the first preliminary lower electrode layer within a certain thickness from the surface of the first preliminary lower electrode layer, thereby forming the third sub-lower electrode layer 162E2. The remaining portion of the first preliminary lower electrode layer may be referred to as the fourth sub-lower electrode layer 164E2. Next, a second preliminary lower electrode layer (not shown) including a niobium oxide may be formed on the third sub-lower electrode layer 162E2, a nitridation process may be performed on a surface of the second preliminary lower electrode layer to transform or convert a niobium oxide to a niobium nitride in a portion of the second preliminary lower electrode layer within a certain thickness from the surface of the second preliminary lower electrode layer, thereby forming the first sub-lower electrode layer 162E1. The remaining portion of the second preliminary lower electrode layer may be referred to as the second sub-lower electrode layer 164E1.

Figure 9:
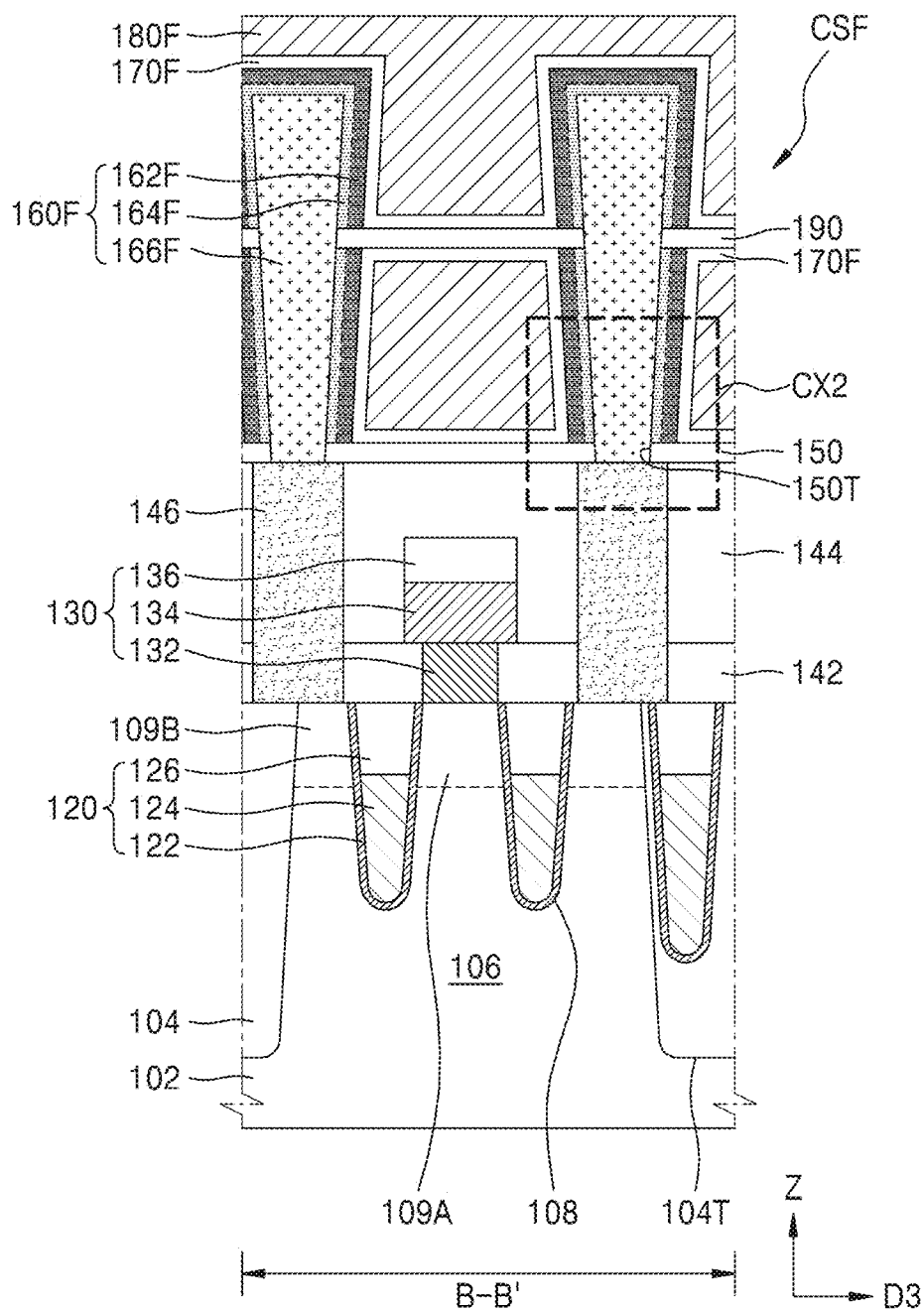
FIG. 9 is a cross-sectional view of a semiconductor device according to an example embodiment.
Figure 10:
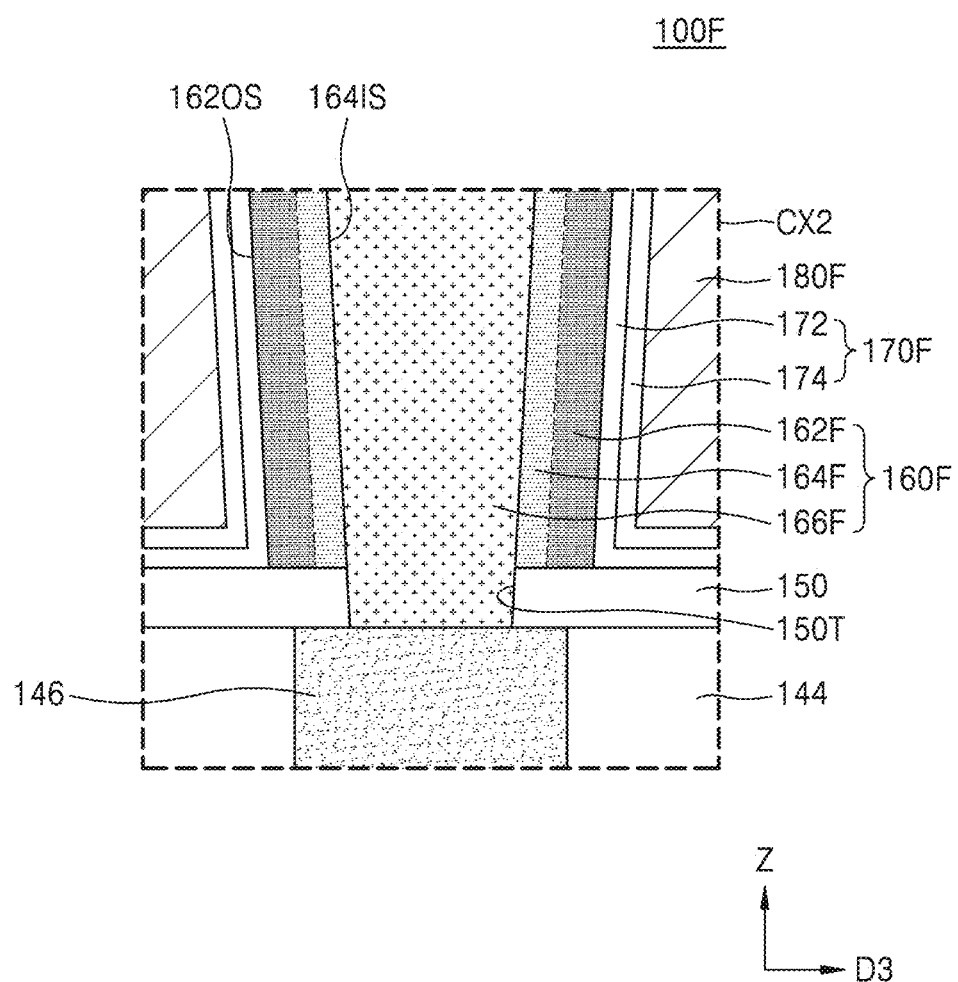
FIG. 10 is an enlarged view of a region CX2 of FIG. 9.

FIG. 9 is a cross-sectional view of a semiconductor device 100F according to an example embodiment, and FIG. 10 is an enlarged view of a region CX2 of FIG. 9. FIG. 9 is a cross-sectional view corresponding to a cross-section cut along a line B-B' in FIG. 1. In FIGS. 9 and 10, reference numerals that are the same as those in FIGS. 1 to 8 denote the same components.

Referring to FIGS. 9 and 10, a capacitor structure CSF may include lower electrode structure 160F having a pillar shape. A supporting member 190 may be on a portion of a sidewall of the lower electrode structure 160F to prevent falling of the lower electrode structure 160F. A dielectric layer structure 170F may be conformally formed on the lower electrode structure 160F and the supporting member 190. An upper electrode 180F may fill a space between the lower electrode structure 160F and another lower electrode structure 160F adjacent thereto on the dielectric layer structure 170F.

The lower electrode structure 160F may include lower base layer 166F having a pillar shape, a second lower electrode layer 164F covering sidewalls and the top surface of the lower base layer 166F, and a first lower electrode layer 162F covering the sidewalls and the top surface of the second lower electrode layer 164F. The second lower electrode layer 164F may include a niobium oxide, and the first lower electrode layer 162F may include a niobium nitride.

An inner wall 164IS of the second lower electrode layer 164F surrounds the outer surfaces of the lower base layer 166F (e.g., the surface of the lower base layer 166F except for portions of the lower base layer 166F contacting the supporting member 190 and the etch stop layer 150), and the outer wall 162OS of the first lower electrode layer 162F may contact the first dielectric layer 172. The first dielectric layer 172 may include a hafnium oxide having a tetragonal crystalline phase.

Meanwhile, FIG. 9 shows an example in which first and second lower electrode layers 162F and 164F are on the topmost surface of the lower base layer 166F. Alternatively, the first and second lower electrode layers 162F and 164F may not be on the topmost surface of the lower base layer 166F. Instead, the dielectric layer structure 170F may be disposed directly on the topmost surface of the lower base layer 166F.

FIGS. 11 to 17 are cross-sectional views of a method of manufacturing the semiconductor device 100, according to example embodiments according to an operation sequence.

Figure 11:
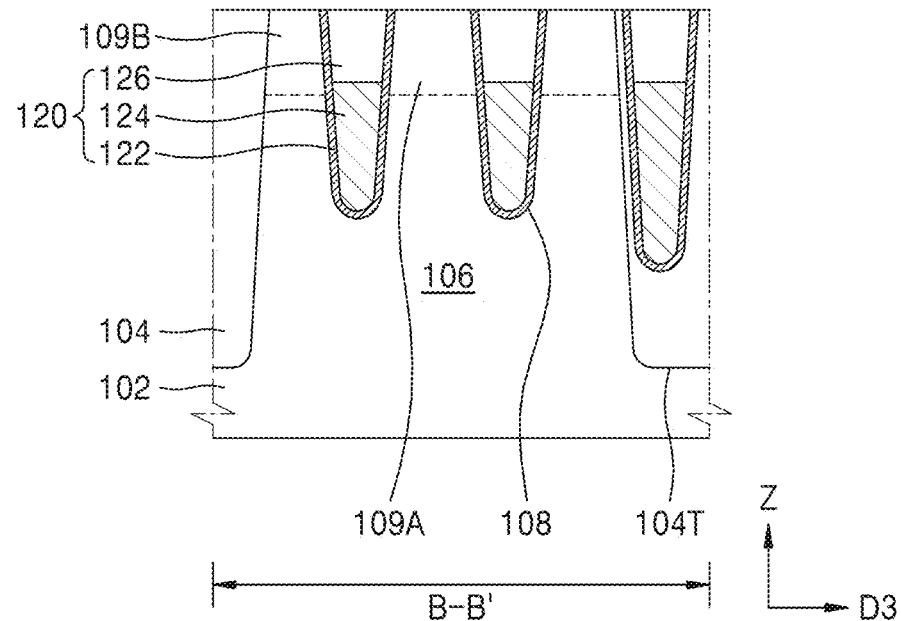
FIGS. 11 to 17 are cross-sectional views of a method of manufacturing the semiconductor device according to example embodiments according to an operation sequence.

Referring to FIG. 11, the device isolating trench 104T may be in the substrate 102, and the device isolation layer 104 may be formed in the device isolating trench 104T. The active region 106 may be defined on the substrate 102 by the device isolation layer 104.

Next, a first mask (not shown) may be formed on the substrate 102, and the gate line trench 108 may be formed in the substrate 102 by using the first mask as an etch mask. Gate line trenches 108 extend parallel to one another and may have a line shape across the active region 106.

Next, the gate insulation layer 122 may be formed on the inner wall of the gate line trench 108. After a gate conductive layer (not shown) filling the interior of the gate line trench 108 is formed on the gate insulation layer 122, the gate electrode 124 may be formed by removing an upper portion of the gate conductive layer by a certain height through an etchback process.

Next, an insulating material may be formed to fill the remaining portion of the gate line trench 108, and the gate capping layer 126 may be formed on the inner wall of the gate line trench 108 by planarizing the insulating material so that the top surface of the substrate 102 is exposed. The first mask may then be removed.

Next, impurity ions may be implanted into portions of the substrate 102 on both sides of the gate structure 120, thereby forming first and second source/drain regions 109A and 109B. Alternatively, after the device isolation layer 104 is formed, first and second source/drain regions 109A and 109B may be formed above the active region 106 by implanting impurity ions into the substrate 102.

Figure 12:
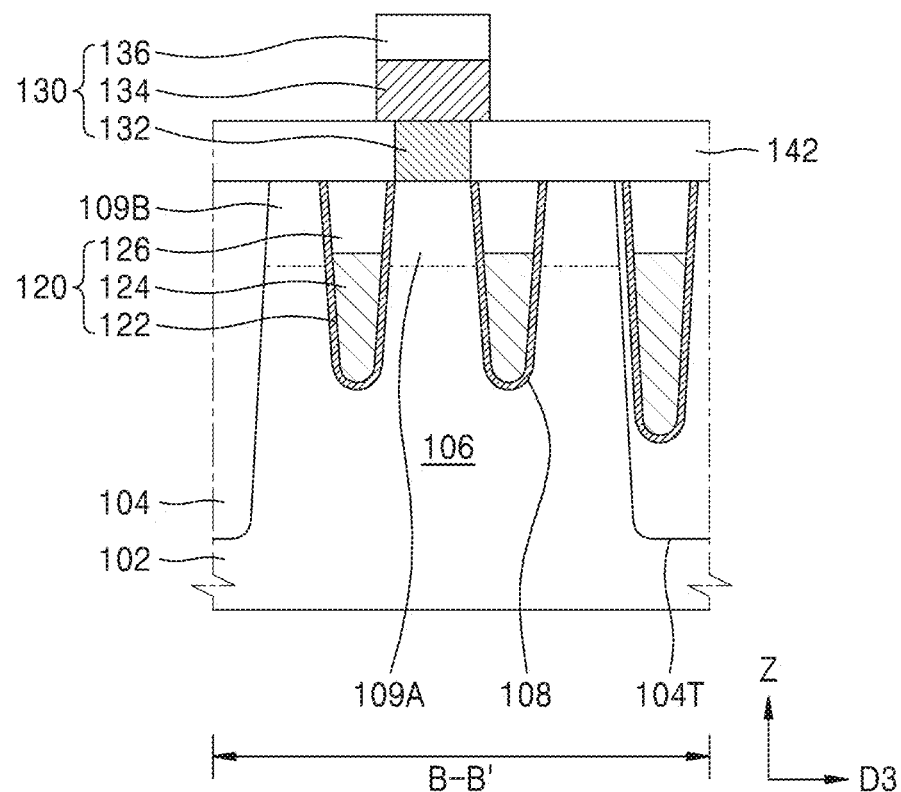

Referring to FIG. 12, the first interlayer insulation layer 142 may be formed on the substrate 102, and an opening (not shown) that exposes the top surface of a first source/drain region 109A may be formed in the first interlayer insulation layer 142. A conductive layer (not shown) filling the opening may be formed on the first interlayer insulation layer 142, and the bit line contact 132 electrically connected to the first source/drain region 109A may be formed in the opening by planarizing the conductive layer.

Next, a conductive layer (not shown) and an insulating layer (not shown) may be sequentially formed over the first interlayer insulation layer 142, and the insulation layer and the conductive layer may be patterned to form the bit line capping layer 136 and the bit line 134 that extend in the Y direction parallel to the top surface of the substrate 102. Although not shown, bit line spacers (not shown) may be further formed on sidewalls of the bit line 134 and the bit line capping layer 136.

Figure 13:
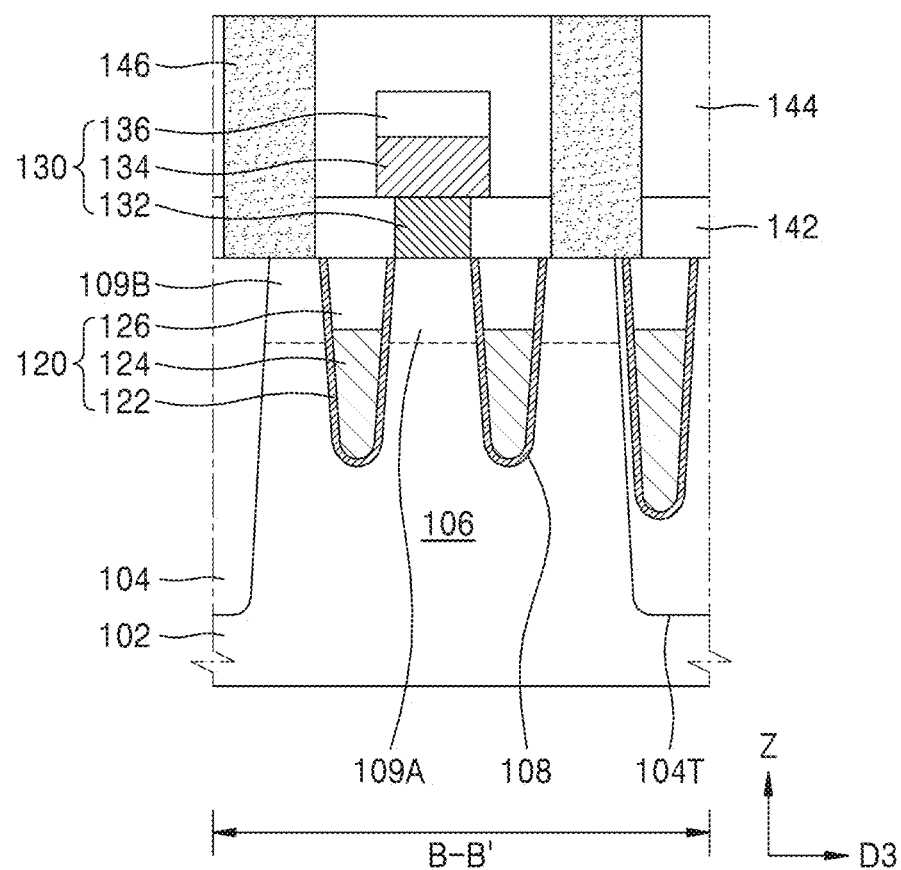

Referring to FIG. 13, the second interlayer insulation layer 144 covering the bit line 134 and the bit line capping layer 136 may be formed on the first interlayer insulation layer 142.

Next, an opening (not shown) that exposes the top surface of the second source/drain region 109B may be formed in the first and second interlayer insulation layers 142 and 144, and the contact structure 146 may be formed in the opening. According to example embodiments, the contact structure 146 may be formed by sequentially forming a lower contact pattern (not shown), a metal silicide layer (not shown), a barrier layer (not shown), and an upper contact pattern (not shown) inside the opening.

Figure 14:
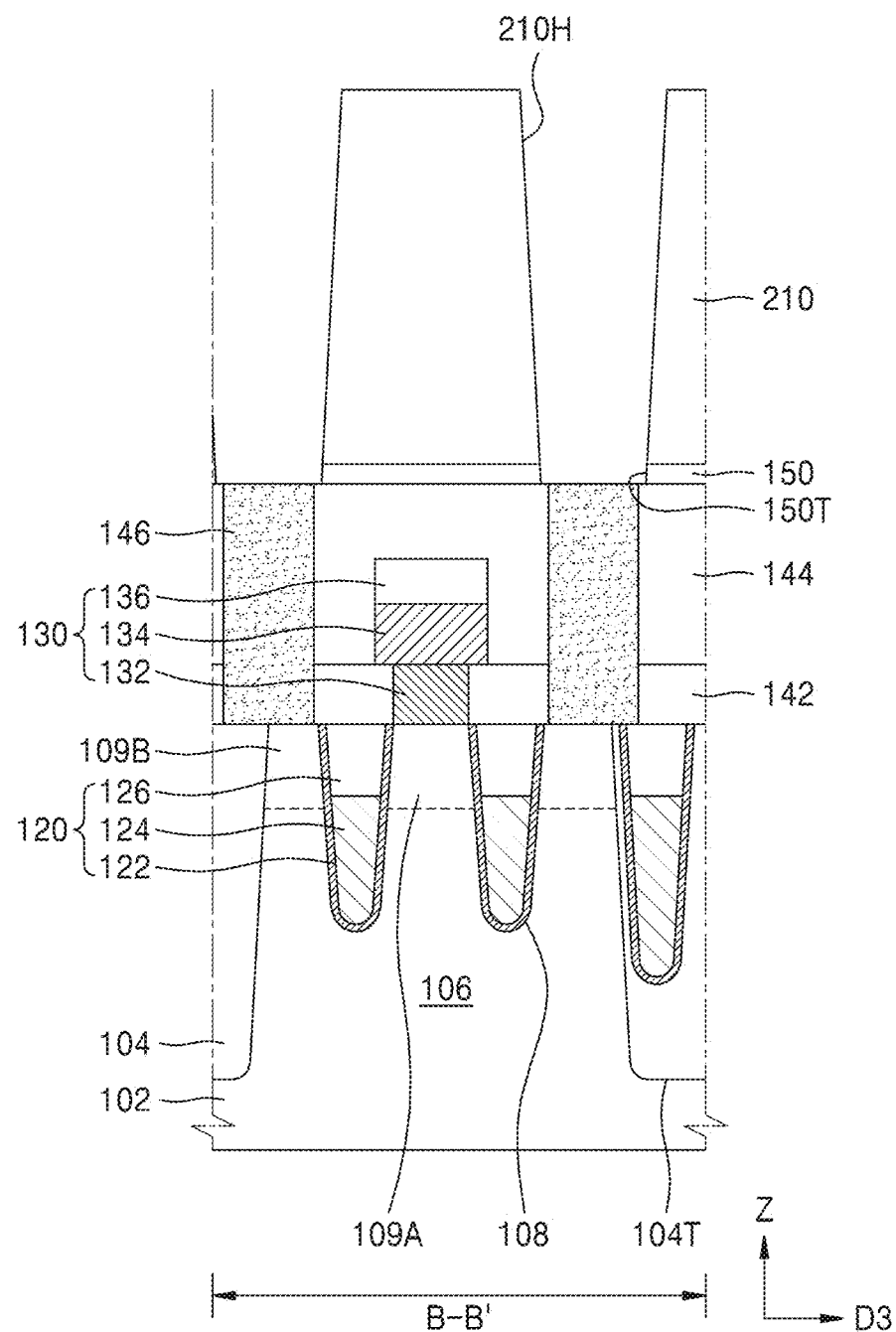

Referring to FIG. 14, after the etch stop layer 150 and the mold layer 210 are sequentially formed on the second interlayer insulation layer 144 and the contact structure 146, the opening 210H and the opening 150T may be formed in the mold layer 210 and the etch stop layer 150, respectively. The top surface of the contact structure 146 may be exposed by the opening 210H and the opening 150T.

According to example embodiments, the mold layer 210 and the etch stop layer 150 may include materials having etch selectivity with respect to each other. For example, when the mold layer 210 includes a silicon oxide, the etch stop layer 150 may include a silicon nitride. According to example embodiments, the mold layer 210 may be formed as a plurality of layers with materials having different etch rates.

Figure 18:
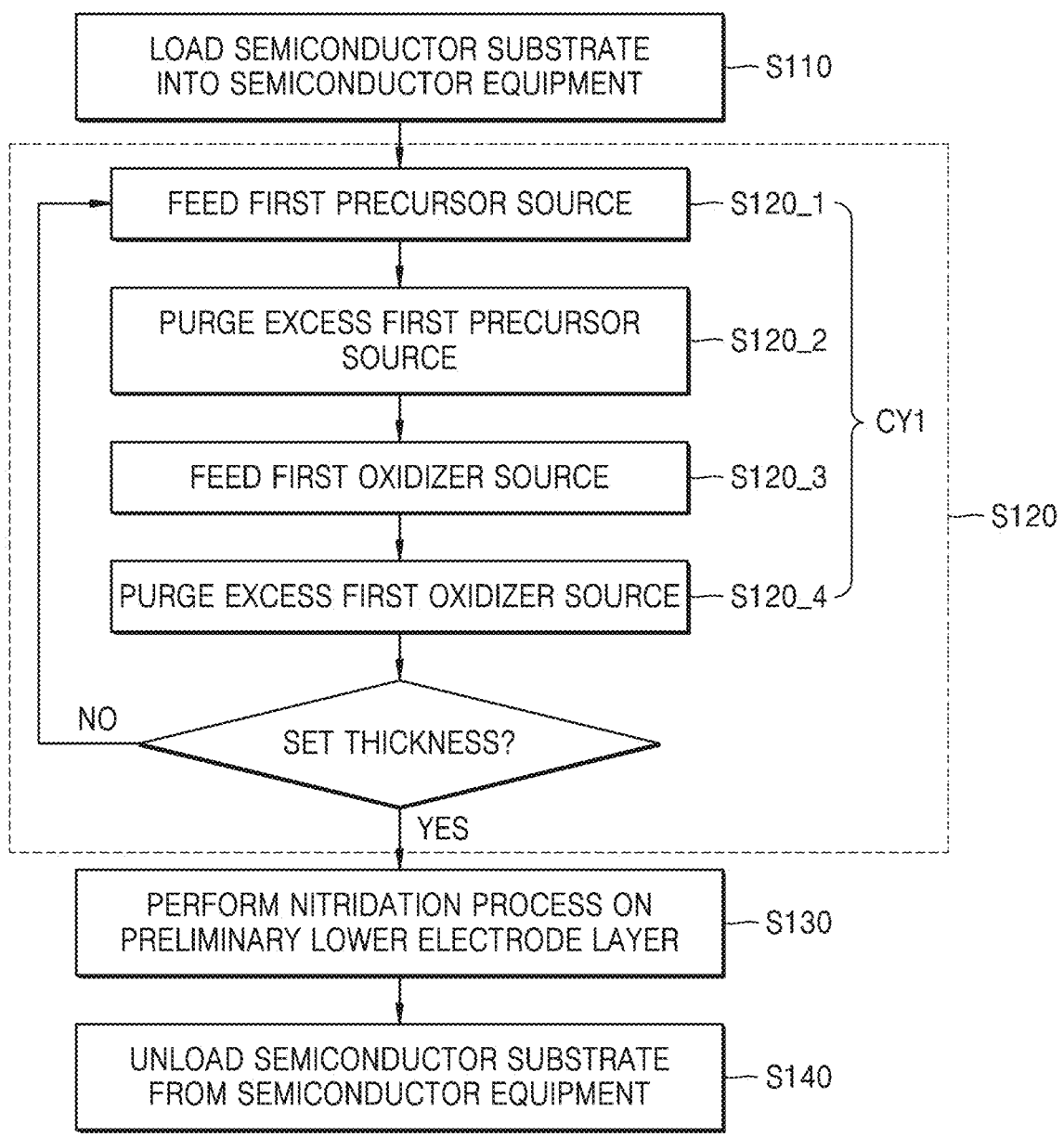
FIG. 18 is a schematic flowchart of a process for manufacturing a lower electrode structure through an in-situ atomic layer deposition (ALD) process according to example embodiments.

Referring to FIG. 15 together with FIG. 18, the preliminary lower electrode layer 160P including a niobium oxide may be formed on the etch stop layer 150 and the mold layer 210 to conformally cover the inner walls of openings 150T and 210H.

For example, an operation for forming the preliminary lower electrode layer 160P may be performed by a chemical vapor deposition (CVD) process, a metal organic CVD (MOCVD) process, an atomic layer deposition (ALD) process, or a metal organic ALD (MOALD) process.

FIG. 18 is a flowchart of an operation for fabricating the lower electrode structure 160 through an in-situ ALD process according to example embodiments.

First, a semiconductor substrate may be loaded into semiconductor equipment (operation S110). The semiconductor substrate may include the substrate 102 on which the mold layer 210 is formed by performing the operations described above with reference to FIGS. 11 to 14. The semiconductor equipment may include a deposition chamber 1120 (see FIG. 25), and the substrate 102 may be loaded into the deposition chamber 1120.

Next, an operation for depositing a preliminary lower electrode layer may be performed (operation S120). The operation for depositing a preliminary lower electrode layer may be performed by repeating a material layer forming cycle CY1 for a plurality of number of times. The material layer forming cycle CY1 may include an operation for feeding a first precursor source (operation S120_1), an operation for purging an excess first precursor source (operation S120_2), an operation for feeding a first oxidizer source (operation S120_3), and an operation for purging an excess first oxidizer source (operation S120_4).

In operation S120_1 for feeding the first precursor source, the first precursor source may form a monolayer of the first precursor source on the mold layer 210 and on the inner wall of the opening 210H.

For example, the first precursor source may be a metal organic precursor including niobium or a halide precursor including niobium. The first precursor source may be tris (diethylamide)(tert-butylimido)niobium (TBTDEN), (tert-butylimido)bis(dimethylamino)niobium (TBTDMN), (tert-butylimido)bis(ethylmethylamino)-niobium (TBTEMN), or bis(cyclopentadienyl)niobium(IV) dichloride, but is not limited thereto. The first precursor source may include a niobium (Nb)-nitrogen (N) bond, an Nb=N bond, an Nb—C bond, an Nb=C bond, or an Nb—Cl bond. The first precursor source may include hydrocarbons bound to Nb atoms.

In operation S120_2 for purging the excess first precursor source, the excess first precursor source may be removed or purged from the deposition chamber 1120.

In operation S120_3 for feeding the first oxidizer source, the first oxidizer source may be fed into the deposition chamber 1120, thereby forming a monolayer of the first oxidizer source on the mold layer 210 and on the inner wall of the opening 210H. On the other hand, the first precursor source may react with the first oxidizer source, and thus a niobium oxide ($NbO_y$, $0.5<y<2.5$) material layer may be formed. According to example embodiments, the first oxidizer source may include, but is not limited to, $O_2$, $O_3$, $H_2O$, $H_2O_2$, a metal alkoxide, or an oxygen-based plasma.

In operation S120_4 for purging the excess first oxidizer source, the excess first oxidizer source may be removed or purged from the deposition chamber 1120.

The material layer forming cycle CY1 may be repeated for a plurality of number of times until the thickness of the preliminary lower electrode layer 160P reaches a set thickness.

Figure 16:
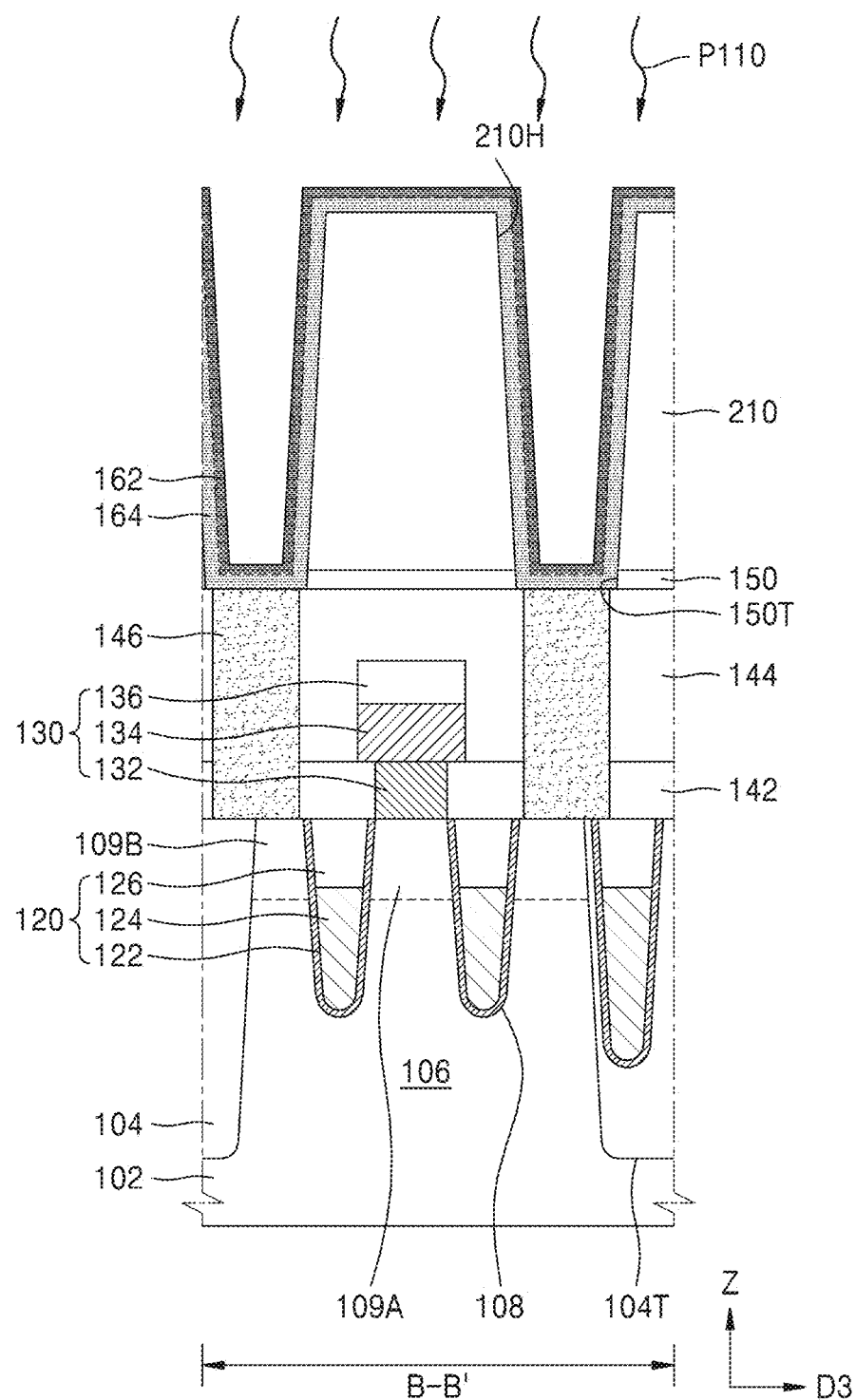

Referring to FIG. 16 together with FIG. 18, after the thickness of the preliminary lower electrode layer 160P (see FIG. 15) reaches the set thickness, a nitridation process may be performed on the preliminary lower electrode layer 160P (operation S130).

A nitridation gas P110 may be supplied to the preliminary lower electrode layer 160P in the nitridation process, and a niobium oxide in a portion of the preliminary lower electrode layer 160P within a certain thickness from the top surface of the preliminary lower electrode layer 160P may be converted into a niobium nitride. The portion of the preliminary lower electrode layer 160P including the niobium nitride may be referred to as the first lower electrode layer 162, and another portion of the preliminary lower electrode layer 160P remaining below the first lower electrode layer 162 may be referred to as the second lower electrode layer 164.

According to example embodiments, the nitridation process may be, but is not limited to, a plasma nitridation process or a thermal nitridation process. In the nitridation process, at least one nitrogen source from among $NH_3$, $N_2H_6$, $N_2H_4$, $N_2H_2$, Hz, and $N_2$ may be used as the reducing agent, but is not limited thereto.

According to example embodiments, the nitridation process may be performed inside the deposition chamber 1120. In this case, operation for forming the preliminary lower electrode layer 160P and the nitridation process for forming the first lower electrode layer 162 may be performed without interrupting the vacuum atmosphere, and formation of unwanted natural oxides or impurity penetration may be prevented.

Next, the semiconductor substrate may be unloaded from the semiconductor equipment (operation S140).

Optionally, a surface treatment may be performed before the material layer forming cycle CY1 or after the nitridation process. For example, the surface treatment may include a hydrogen plasma treatment.

According to the example embodiments described above, the material layer forming cycle CY1 may be repeatedly performed to form the preliminary lower electrode layer 160P including a niobium oxide and convert a niobium oxide in a portion of the preliminary lower electrode layer 160P to a niobium nitride through a nitridation process, thereby forming the first lower electrode layer 162. During the material layer forming cycle CY1, impurities such as carbon contained in the metal organic precursor including niobium may be effectively oxidized and removed under an oxidizing atmosphere due to the first oxidizer source. Accordingly, the preliminary lower electrode layer 160P including niobium oxide of relatively high quality may be formed, and the first lower electrode layer 162 including niobium nitride of relatively high quality may be formed therefrom.

Figure 17:
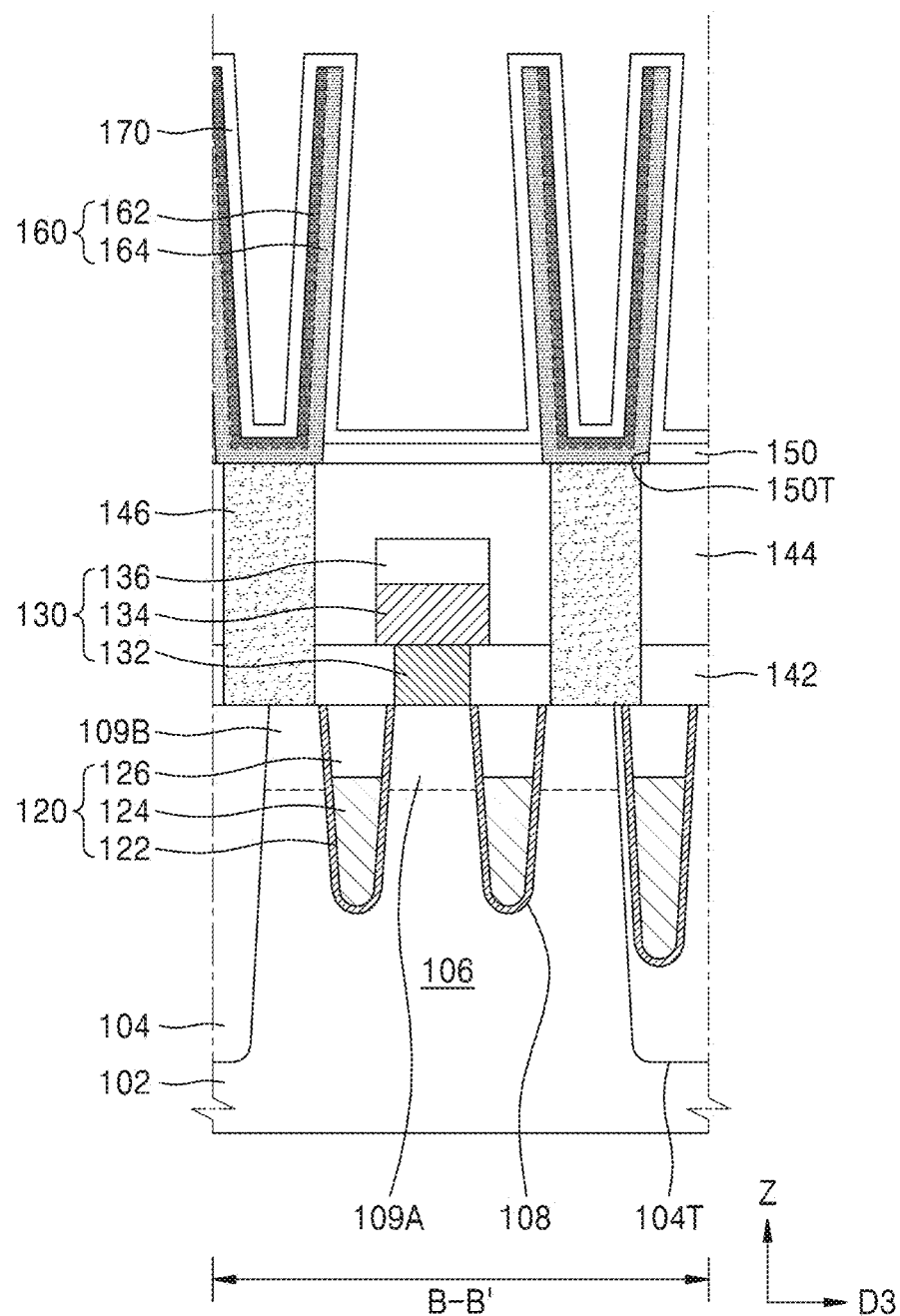

Referring to FIG. 17, the lower electrode structure 160 may be formed by removing portions of the first lower electrode layer 162 and the second lower electrode layer 164 located on the top surface of the mold layer 210 (see FIG. 16) through an etchback process.

Next, the mold layer 210 may be removed. In an operation for removing the mold layer 210, the etch stop layer 150 may remain by not being removed. The lower electrode structure 160 may be formed on the contact structure 146 and have a cylindrical shape with a closed bottom.

Next, the first dielectric layer 172 (see FIG. 3) and the second dielectric layer 174 (see FIG. 3) may be sequentially formed on the lower electrode structure 160 and the etch stop layer 150. The first dielectric layer 172 may be formed through a PVD process, a CVD process, an MOCVD process, an ALD process, or a MOALD process by using a hafnium oxide.

Referring back to FIGS. 2 and 3, the upper electrode 180 may be formed on the second dielectric layer 174.

Optionally, a heat treatment may be performed after operation for forming the first dielectric layer 172 or after operation for forming the second dielectric layer 174.

Accordingly, the semiconductor device 100 may be completed.

According to the method of manufacturing the semiconductor device 100, the preliminary lower electrode layer 160P including a niobium oxide may be formed, and then a niobium oxide in a portion of the preliminary lower electrode layer 160P may be converted into a niobium nitride through a nitridation process, thereby forming the first lower electrode layer 162. In operation for forming a niobium oxide, impurities such as carbon contained in the metal organic precursor including niobium may be effectively oxidized and removed under an oxidizing atmosphere due to the first oxidizer source. Accordingly, the preliminary lower electrode layer 160P including niobium oxide of relatively high quality may be formed, and the first lower electrode layer 162 including niobium nitride of relatively high quality may be formed therefrom. Also, the first dielectric layer 172 including a hafnium oxide having a tetragonal crystalline phase may be formed on the lower electrode structure 160 including a niobium nitride or a niobium oxide, and thus the semiconductor device 100 may have a relatively high capacitance.

Figure 19:
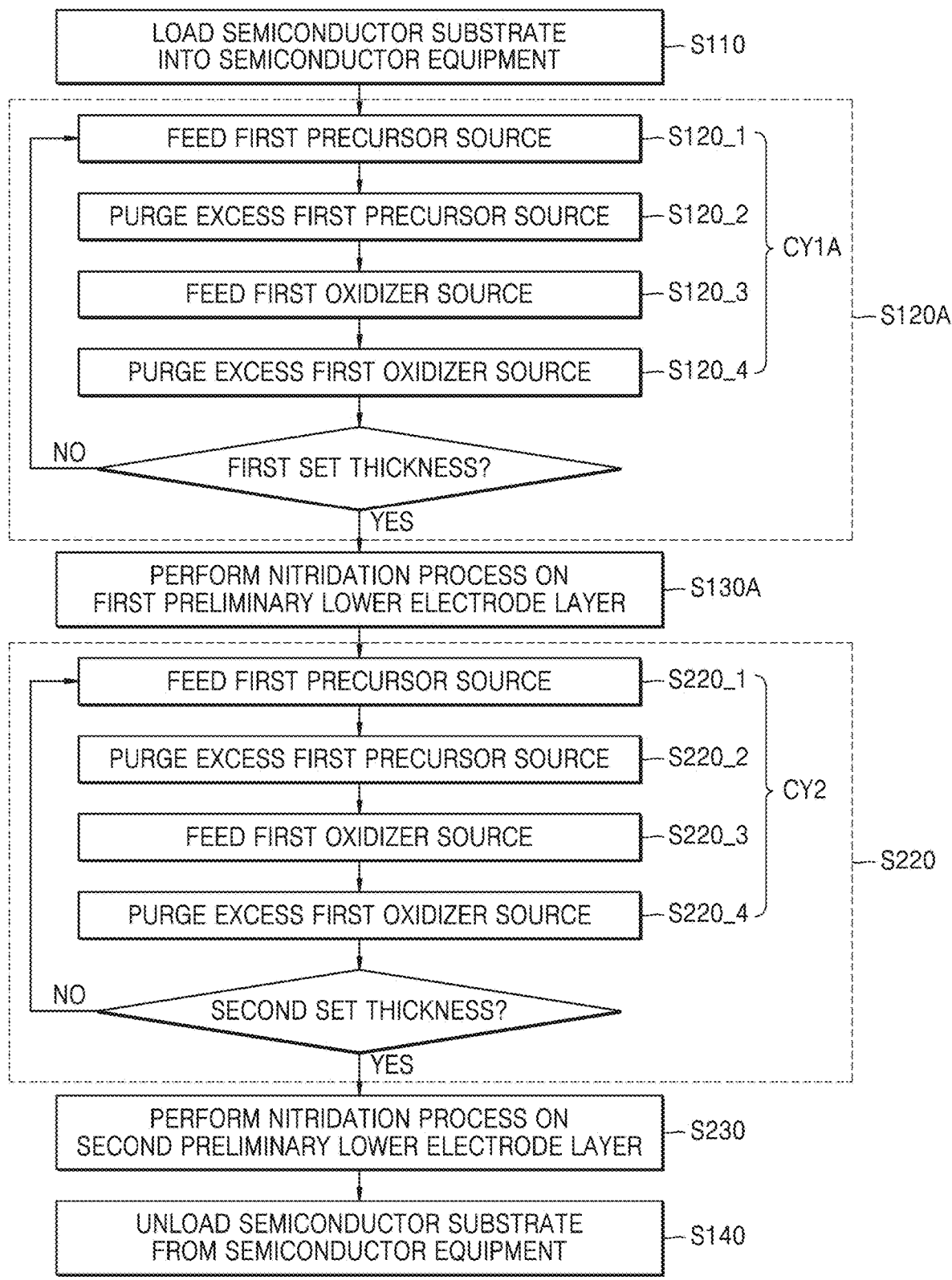
FIG. 19 is a schematic flowchart of a process for manufacturing a lower electrode structure through an in-situ ALD process according to example embodiments.

FIG. 19 is a flowchart of an operation for manufacturing a lower electrode structure 160E through an in-situ ALD process according to example embodiments. The operation shown in FIG. 19 may be an example method of manufacturing the semiconductor device 100E described above with reference to FIG. 8.

Referring to FIG. 19 together with FIG. 8, a first material layer forming cycle CY1A is repeated for a plurality of number of times, thereby forming a first preliminary lower electrode layer (not shown) (operation S120A). When the first preliminary lower electrode layer reaches a first set thickness, the third sub-lower electrode layer 162E2 and the fourth sub-lower electrode layer 164E2 may be formed by performing a nitridation process on the first preliminary lower electrode layer (operation S130A). The third sub-lower electrode layer 162E2 may include a niobium nitride converted from a niobium oxide in the first preliminary lower electrode layer.

Next, the second material layer forming cycle CY2 is repeated for a plurality of number of times, thereby forming a second preliminary lower electrode layer (operation S220). When the second preliminary lower electrode layer reaches a second set thickness, the first sub-lower electrode layer 162E1 and the second sub-lower electrode layer 164E1 may be formed by performing a nitridation process on the second preliminary lower electrode layer (operation S230). The first sub-lower electrode layer 162E1 may include a niobium nitride converted from a niobium oxide in the second preliminary lower electrode layer.

Meanwhile, although FIGS. 19 and 8 show cases where each of the material layer forming cycles CY1A and CY2 and nitridation processes are repeated twice, the inventive concepts are not limited thereto. In other embodiments, each of the material layer forming cycles CY1A and CY2 and the nitridation processes may be repeated three times or more. Even in this case, the semiconductor device 100C including the lower electrode structure 160C as described above with reference to FIG. 6 may be formed.

Meanwhile, FIGS. 19 and 8 show cases in which only a portion of the thickness of the second preliminary lower electrode layer is converted into the first sub-lower electrode layer 162E1 including a niobium nitride, the remaining portion of the second preliminary lower electrode layer is referred to as the second sub-lower electrode layer 162E2, and the second sub-lower electrode layer 162E2 includes a niobium oxide including no or relatively low nitrogen content. However, the inventive concepts are limited thereto. According to other example embodiments, the entire second preliminary lower electrode layer may be converted to the first sub-lower electrode layer 162C1 through a nitridation process. In this case, the semiconductor device 100C including the lower electrode structure 160C as described above with reference to FIG. 6 or the semiconductor device 100B including the lower electrode structure 160B as described above with reference to FIG. 5 may be formed.

Figure 20:
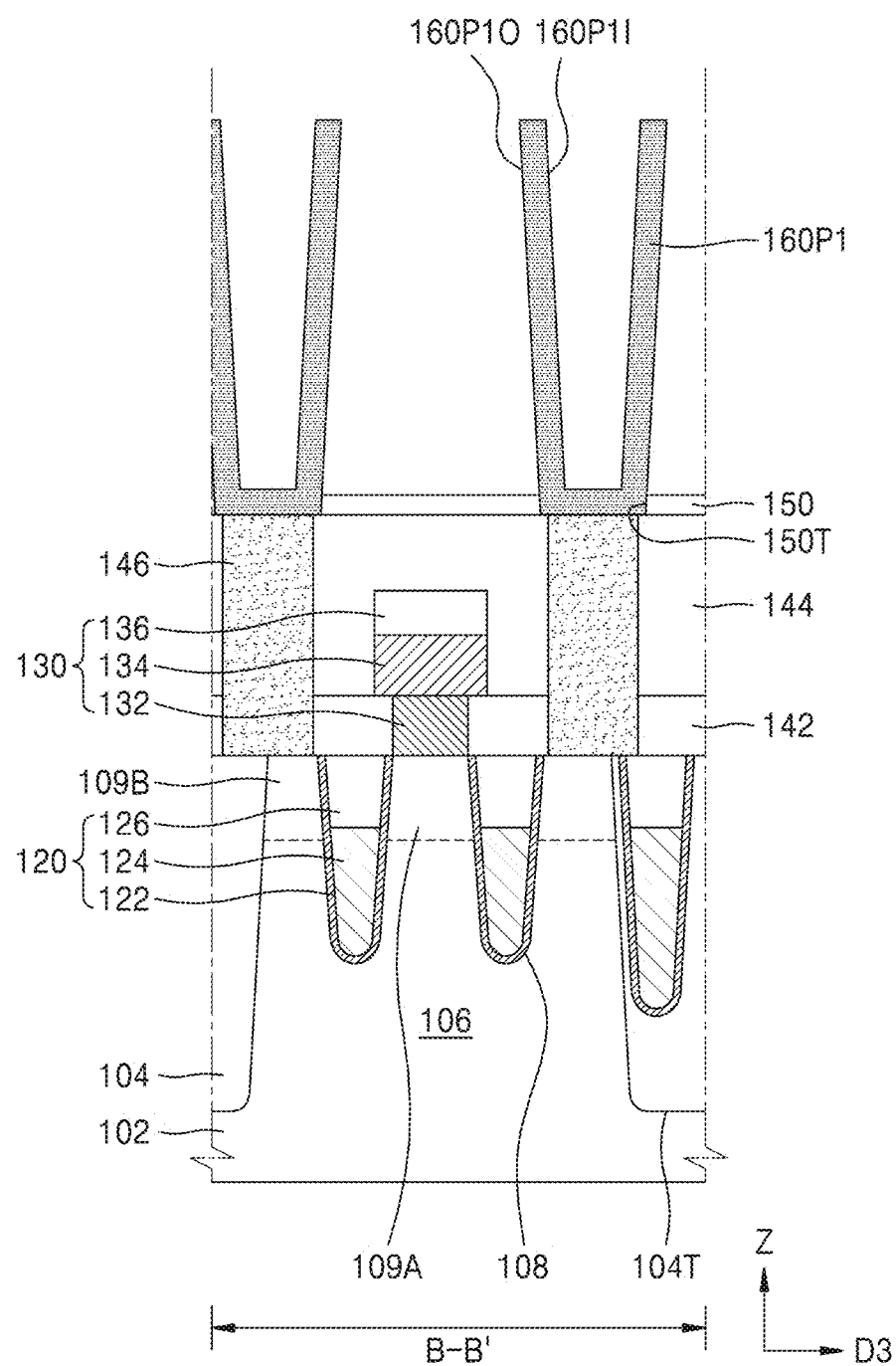
FIGS. 20 and 21 are cross-sectional views of a method of manufacturing the semiconductor device according to example embodiments according to an operation sequence.
Figure 21:
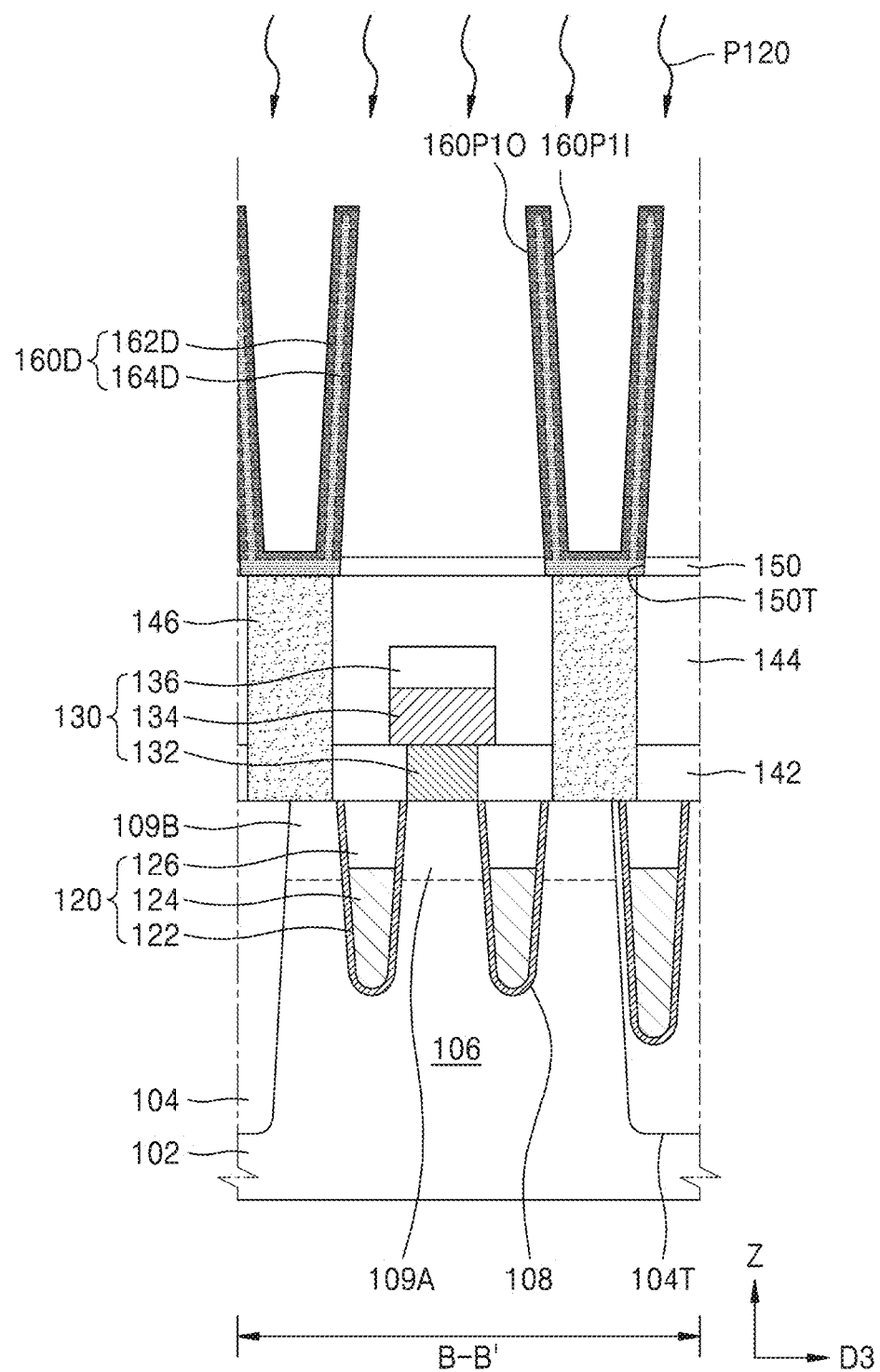

FIGS. 20 and 21 are cross-sectional views of a method of manufacturing the semiconductor device 100D according to example embodiments according to an operation sequence.

First, by performing operations described above with reference to FIGS. 11 to 16, a structure in which the preliminary lower electrode layer 160P is formed on the mold layer 210 and the inner wall of the opening 210H is obtained.

Referring to FIG. 20, a portion of the preliminary lower electrode layer 160P located on the top surface of the mold layer 210 may be removed through an etchback operation, thereby forming a preliminary lower electrode structure 160P1.

Next, the mold layer 210 may be removed.

Referring to FIG. 21, a nitridation process may be performed by supplying a nitridation gas P120 onto the preliminary lower electrode structure 160P1. Both an outer sidewall 160P1O and an inner sidewall 160P1I of the preliminary lower electrode structure 160P1O may be exposed to a nitridation process atmosphere, and a niobium oxide in portions of the preliminary lower electrode structure 160P1 within certain thicknesses from the outer sidewall 160P1O and the inner sidewall 160P1I of the preliminary lower electrode structure 160P1 may be converted to a niobium nitride. Accordingly, the first lower electrode layer 162D may be formed in portions of the preliminary lower electrode structure 160P1 within a predetermined thickness from the outer sidewall 160P1O and the inner sidewall 160P1I of the preliminary lower electrode structure 160P1, and the remaining portion of the preliminary lower electrode structure 160P1 may be referred to as the second lower electrode layer 164D.

Next, operation described above with reference to FIG. 17 may be performed. In detail, the first dielectric layer 172 and the second dielectric layer 174 may be sequentially formed on the lower electrode structure 160D, and the upper electrode 180 may be formed on the second dielectric layer 174.

Accordingly, forming of the semiconductor device 100D may be completed.

Figure 22:
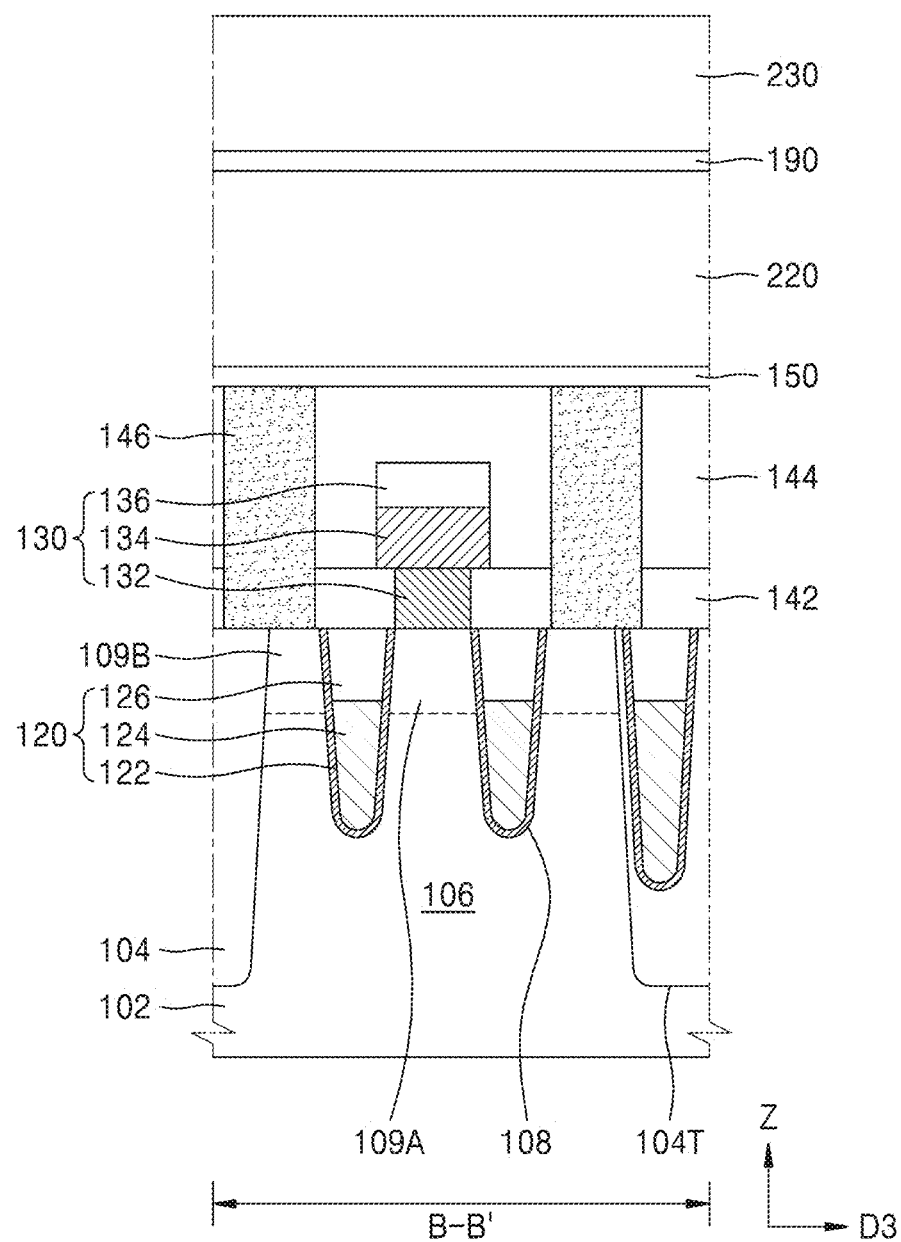
FIGS. 22 to 24 are cross-sectional views of a method of manufacturing a semiconductor device according to example embodiments according to an operation sequence.
Figure 23:
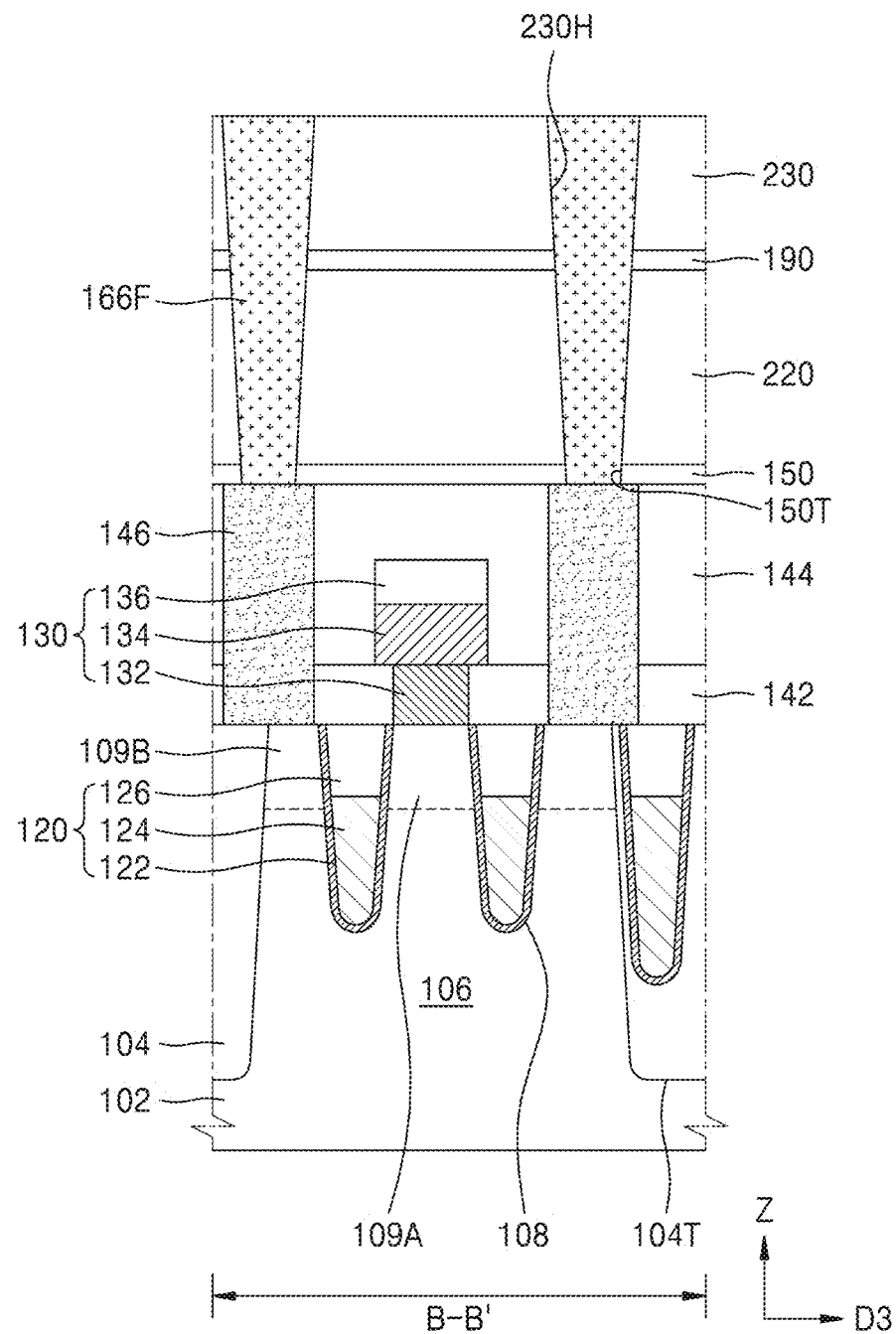
Figure 24:
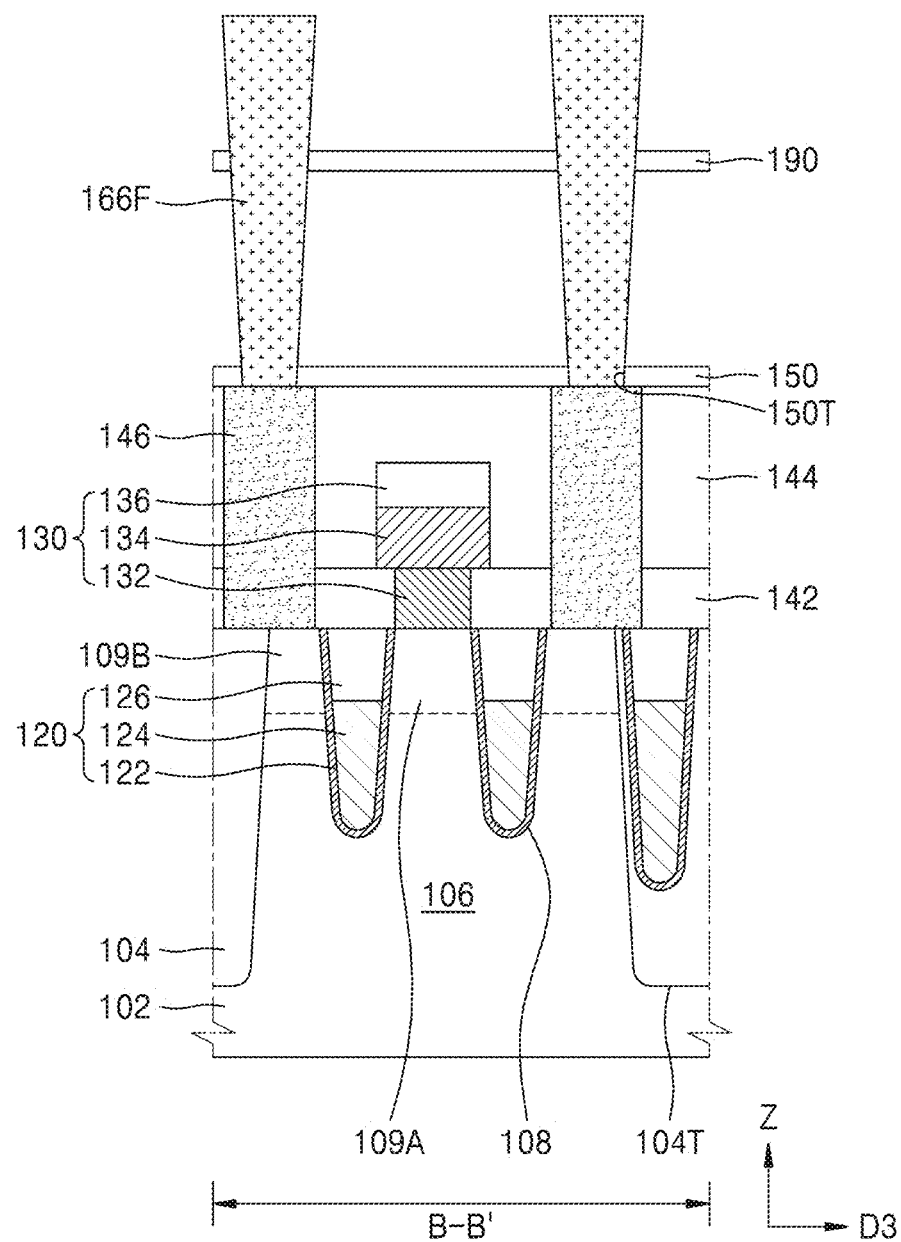

FIGS. 22 to 24 are cross-sectional views of a method of manufacturing the semiconductor device 100F according to example embodiments according to an operation sequence.

First, by performing operations described above with reference to FIGS. 11 to 13, a structure in which the second interlayer insulation layer 144 and the contact structure 146 are formed is obtained.

Referring to FIG. 22, the etch stop layer 150, a first mold layer 220, the supporting member 190, and/or a second mold layer 230 may be sequentially formed on the second interlayer insulation layer 144 and the contact structure 146.

According to example embodiments, the etch stop layer 150 and first and second mold layers 220 and 230 may include materials having etch selectivity with respect to one another. Also, the supporting member 190 and the first and second mold layers 220 and 230 may include materials having etch selectivity with respect to one another. The first and second mold layers 220 and 230 may include a same material or different materials. For example, first and second mold layers 220 and 230 may include a silicon oxide, and the etch stop layer 150 and the supporting member 190 may include a silicon nitride.

Referring to FIG. 23, an opening 230H penetrating through the second mold layer 230, the supporting member 190, and the first mold layer 220, and the opening 150T penetrating through the etch stop layer 150 may be sequentially formed. Openings 230H and 150T may expose the top surface of the contact structure 146, and side surfaces of the supporting member 190 may be exposed on an inner wall of the opening 230H.

Next, a lower electrode layer (not shown) filling the openings 150T and 230H may be formed on the second mold layer 230, and an upper portion of the lower electrode layer may be etched back so that the top surface of the second mold layer 230 is exposed, thereby forming the lower base layer 166F.

The lower base layer 166F may be formed to have a pillar shape and fill the openings 150T and 230H. The supporting member 190 may be brought into contact with the sidewall of the lower base layer 166F.

Referring to FIG. 24, the first and second mold layers 220 and 230 (see FIG. 23) may be removed.

First, the second mold layer 230 may be removed. After a patterning operation for forming an open region (not shown) in the supporting member 190, the first mold layer 220 may be removed through the open region. However, the inventive concepts are not limited thereto. Unlike the case described above, the patterning operation for forming the open region may be performed together during operation for forming the supporting member 190.

On the other hand, during operation for removing the first and second mold layers 220 and 230, the supporting member 190 may remain by not being removed. The supporting member 190 may be disposed between the lower base layer 166F and another lower base layer 166F adjacent thereto to prevent falling or leaning of the lower base layer 166F.

Referring back to FIGS. 9 and 10, the first lower electrode layer 162F and the second lower electrode layer 164F may be formed on an exposed surface of the lower base layer 166F. operations for forming the first lower electrode layer 162F and the second lower electrode layer 164F may be similar to those described above with reference to FIGS. 15, 16, and 18.

Next, by performing operation described above with reference to FIG. 17, the first dielectric layer 172 and the second dielectric layer 174 may be sequentially formed over the lower electrode structure 160F, and the upper electrode 180 may be formed on the second dielectric layer 174.

Accordingly, forming of the semiconductor device 100F may be completed.

Hereinafter, the semiconductor equipment as described above in FIGS. 18 and 19 will be described with reference to FIGS. 25 and 26. For example, as described above with reference to FIGS. 18 and 19, the semiconductor equipment may be semiconductor equipment capable of performing deposition processes and nitridation processes for forming at least one of the semiconductor devices according to the above-described embodiments without vacuum interruption.

Figure 25:
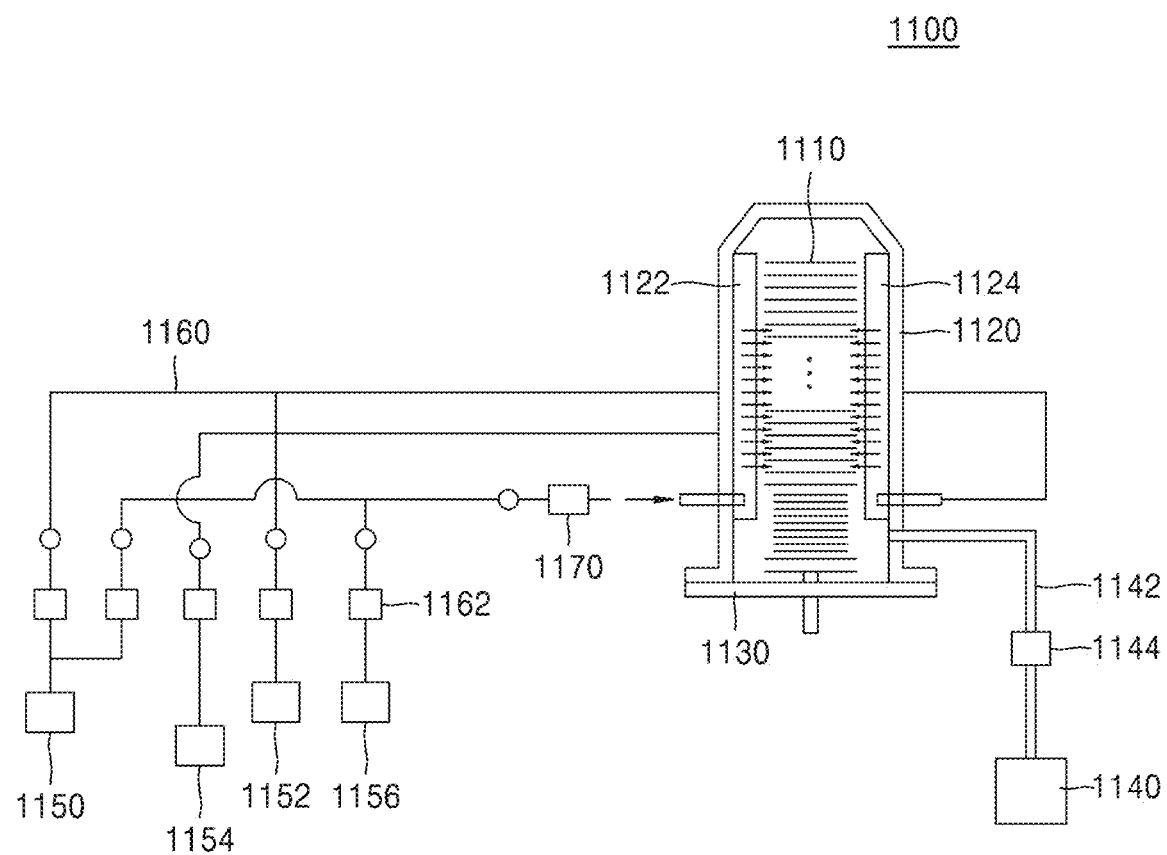
FIG. 25 is a schematic view of semiconductor equipment according to an example embodiment.

FIG. 25 is a schematic view of semiconductor equipment 1100 according to an example embodiment.

Referring to FIG. 25, the semiconductor equipment 1100 may include the deposition chamber 1120 and a substrate accommodator 1110 and a boat support 1130 inside the deposition chamber 1120.

The deposition chamber 1120 may be a reactor tube or a process chamber. The substrate accommodator 1110 may include a boat and a substrate susceptor. The substrate susceptor may be a portion where a substrate loaded into the deposition chamber 1120 in the semiconductor equipment 1100 is located.

A first nozzle portion 1122 and a second nozzle portion 1124 are disposed within the deposition chamber 1120 and may be on side surfaces of the substrate accommodator 1110. The first nozzle portion 1122 may include a nozzle for supplying a nitrogen source material into the deposition chamber 1120 and a second nozzle portion 1124 may include a nozzle for supplying a first precursor source material or a first oxidizer source material into the deposition chamber 1120.

The semiconductor equipment 1100 may include a vacuum pump 1140, a pipe 1142 connecting the vacuum pump 1140 to the deposition chamber 1120, and a valve 1144 installed at the pipe 1142.

The semiconductor equipment 1100 may be connected to an inert gas supplying device 1150, a first source supplying device 1152, a second source supplying device 1154, and a third source supplying device 1156. Materials in the inert gas supplying device 1150, the first source supplying device 1152, the second source supplying device 1154, and the third source supplying device 1156 may be supplied in the form of gases into the deposition chamber 1120 through the pipe 1160. Amounts of the materials in the inert gas supplying device 1150, the first source supplying device 1152, the second source supplying device 1154, and the third source supplying device 1156 to be supplied into the deposition chamber 1120 may be controlled by flux controlling devices or a mass flow controller 1162 installed at the pipe 1160.

The inert gas supplying device 1150 may be a device for supplying an inert gas such as nitrogen used for purging the deposition chamber 1120.

The first source supplying device 1152 may be a device for supplying a first precursor source material such as a metal organic precursor including niobium or a halide precursor including niobium used to form a preliminary lower electrode layer. For example, the first source supplying device 1152 may be a device for supplying the first precursor source material to be used in operation S120 for depositing a preliminary lower electrode layer as described above with reference to FIG. 18.

The second source supplying device 1154 may be a device for supplying a first oxidizer source material such as oxygen or ozone to form a preliminary lower electrode layer. For example, the second source supplying device 1154 may be a device for supplying the first oxidizer source material to be used in operation S120 for depositing a preliminary lower electrode layer as described above with reference to FIG. 18.

The third source supplying device 1156 may be a device for supplying a nitrogen source material used to perform a nitridation process. For example, the third source supplying device 1156 may be a device for supplying a nitrogen source material used in the nitridation process (operation 130) for converting a niobium oxide in a portion of a preliminary lower electrode layer into a niobium nitride as described above with reference to FIG. 18.

The semiconductor equipment 1100 may include a plasma generator 1170. The plasma generator 1170 may be a device capable of generating plasma. FIG. 25 shows merely an example in which the plasma generator 1170 may be disposed within the semiconductor equipment 1100, and the inventive concepts are not limited thereto. For example, the plasma generator 1170 may be disposed inside the deposition chamber 1120 or attached to the deposition chamber 1120.

Processes for depositing a preliminary lower electrode layer and a nitridation process may be performed without vacuum atmosphere interruption by using the semiconductor equipment 1100.

FIG. 25 is a cross-sectional view of semiconductor equipment 1200 according to an example embodiment.

Figure 26:
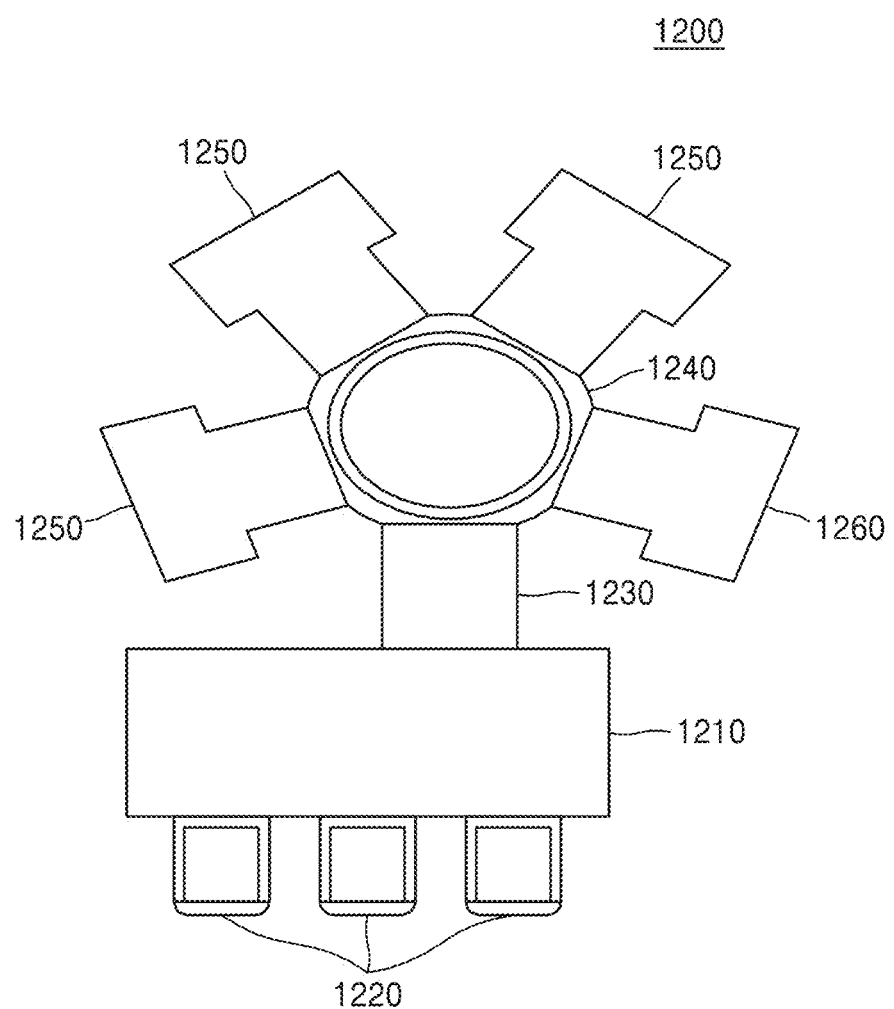
FIG. 26 is a schematic view of semiconductor equipment according to an example embodiment.

Referring to FIG. 26, the semiconductor equipment 1200 may include a load station 1210, a load port 1220, a load-lock chamber 1230, a transfer chamber 1240, a deposition chamber 1250, and a nitridation chamber 1260.

The load station 1210 may be connected to the load port 1220 through which a semiconductor substrate may be transferred. A semiconductor substrate may be loaded into the deposition chamber 1250 through the load port 1220. For example, the substrate, which is brought into the load station 1210 through the load port 1220 at the atmospheric pressure, may be moved into the load-lock chamber 1230 connected to the load station 1210. Next, the load-lock chamber 1230 may be switched from an atmospheric pressure state to a vacuum state, and the substrate in the load-lock chamber 1230 in the vacuum state may be moved into the deposition chamber 1250 through the transfer chamber 1240. The transfer chamber 1240 and the deposition chamber 1250 may be in a vacuum state.

The deposition chamber 1250 may be a chamber in which a deposition operation may be performed. For example, a preliminary lower electrode layer may be formed on a semiconductor substrate transferred into the deposition chamber 1250. A plurality of deposition chambers 1250 may be disposed.

For example, when an operation for depositing the preliminary lower electrode layer is performed in the deposition chamber 1250, a first precursor source material and a first oxidizer source material may be supplied into the deposition chamber 1250, thereby forming the preliminary lower electrode layer.

The semiconductor substrate having formed thereon the preliminary lower electrode layer may be transferred into the nitridation chamber 1260 through the transfer chamber 1240. The nitridation chamber 1260 may be a chamber in which a nitridation process may be performed.

For example, the nitridation chamber 1260 may be a chamber for performing a nitridation process to nitridize the preliminary lower electrode layer. The nitridation process may be a plasma nitridation process. During deposition operations and nitridation processes, the transfer chamber 1240, the deposition chamber 1250, and the nitridation chamber 1260 may be kept in a vacuum state without vacuum interruption.

A semiconductor substrate that has been completely processed in the nitridation chamber 1260 may be unloaded from the nitridation chamber 1260 through the transfer chamber 1240, the load-lock chamber 1230, the load station 1210, and the load port 1220 in the order stated.

As described above, example embodiments have been disclosed in the drawings and specification. Although embodiments have been described herein using specific terminology, it is understood that they have been used only for purposes of describing the inventive concepts and not for limiting the scope of the inventive concepts as defined in the claims. Therefore, one of ordinary skill in the art will appreciate that various modifications and equivalent embodiments are possible without departing from the scope of the inventive concepts. Accordingly, the true scope of protection of the present disclosure should be determined by the technical idea of the appended claims.

What is claimed is:

1. A semiconductor device comprising:
a substrate:
a lower insulating layer disposed on the substrate and including a through hole;
a contact structure disposed in the through hole of the lower insulating layer;
an upper insulating layer disposed on the lower insulating layer;
a lower electrode structure passing through the upper insulating layer and contacting the contact structure, the lower electrode structure including a first lower electrode and a second lower electrode that is disposed on the first lower electrode;
a dielectric layer disposed on the lower electrode structure; and
an upper electrode disposed on the dielectric layer,
wherein the first lower electrode of the lower electrode structure includes niobium oxide,
the second lower electrode of the lower electrode structure includes niobium nitride, and is disposed on an inner side surface and an inner bottom surface of the first lower electrode,
the dielectric layer includes hafnium oxide, and is disposed on an inner side surface and an inner bottom surface of the second lower electrode of the lower electrode structure and on an outer side surface of the first lower electrode of the lower electrode structure, and
the dielectric layer contacts a top surface of the first lower electrode of the lower electrode structure and a top surface of the second lower electrode of the lower electrode structure.

2. The semiconductor device of claim 1, wherein the dielectric layer has a tetragonal crystalline phase.

3. The semiconductor device of claim 1, wherein the dielectric layer contacts a top surface of the upper insulating layer.

4. The semiconductor device of claim 1, wherein the inner side surface of the first lower electrode of the lower electrode structure contacts an outer side surface of the second lower electrode of the lower electrode structure, and
the inner bottom surface of the first lower electrode of the lower electrode structure contacts an outer bottom surface of the second lower electrode of the lower electrode structure.

5. The semiconductor device of claim 1, wherein the top surface of the first lower electrode of the lower electrode structure is substantially coplanar with the top surface of the second lower electrode of the lower electrode structure.

6. The semiconductor device of claim 1, wherein each of the first lower electrode of the lower electrode structure and the second lower electrode of the lower electrode structure is cylinder-shaped with an upper opened end, and
the upper electrode fills in the upper opened end of the second lower electrode of the lower electrode structure.

7. The semiconductor device of claim 1, wherein the dielectric layer further includes at least one from among zirconium oxide, aluminum oxide, silicon oxide, titanium oxide, yttrium oxide, scandium oxide, and lanthanum oxide.

8. The semiconductor device of claim 1, wherein the lower electrode structure includes a third lower electrode that is disposed on the outer side surface and an outer bottom surface of the first lower electrode of the lower electrode structure, and
the third lower electrode contacts a top surface of the contact structure.

9. The semiconductor device of claim 8, wherein the third lower electrode of the lower electrode structure includes at least one selected from among doped polysilicon, ruthenium, titanium, tantalum, tungsten, titanium nitride, tantalum nitride, tungsten nitride and iridium oxide.

10. A semiconductor device comprising:
a substrate;
a lower insulating layer disposed on the substrate and including a through hole;
a contact structure disposed in the through hole of the lower insulating layer;
an upper insulating layer disposed on the lower insulating layer;
a lower electrode structure passing through the upper insulating layer and contacting the contact structure, the lower electrode structure including a first lower electrode and a second lower electrode, the first lower electrode including a bottom portion and a side portion that is disposed on the bottom portion;
a dielectric layer disposed on the lower electrode structure; and
an upper electrode disposed on the dielectric layer,
wherein the second lower electrode of the lower electrode structure is disposed on a top surface of the bottom portion of the first lower electrode, an inner side surface of the side portion of the first lower electrode, an outer side surface of the side portion of the first lower electrode and a top surface of the side portion of the first lower electrode, and
the dielectric layer is disposed on the second lower electrode of the lower electrode structure and does not contact the first lower electrode of the lower electrode structure.

11. The semiconductor device of claim 10, wherein the first lower electrode of the lower electrode structure includes niobium oxide, the second lower electrode of the lower electrode structure includes niobium nitride, and the dielectric layer includes hafnium oxide having a tetragonal crystalline phase.

12. The semiconductor device of claim 11, wherein the dielectric layer further includes at least one from among zirconium oxide, aluminum oxide, silicon oxide, titanium oxide, yttrium oxide, scandium oxide, and lanthanum oxide.

13. The semiconductor device of claim 10, wherein a side surface of the bottom portion of the first lower electrode contacts the upper insulating layer.

14. The semiconductor device of claim 10, wherein the dielectric layer contacts a top surface of the upper insulating layer.

15. The semiconductor device of claim 10, wherein a bottom surface of the bottom portion of the first lower electrode contacts a top surface of the contact structure.

16. A semiconductor device comprising:
a substrate;
a lower insulating layer disposed on the substrate and including a through hole;
a contact structure disposed in the through hole of the lower insulating layer;
an upper insulating layer disposed on the lower insulating layer;
a lower electrode structure disposed on the upper insulating layer, and including a first lower electrode, a second lower electrode and a third lower electrode;
a supporter disposed on the upper insulating layer;
a dielectric layer disposed on the lower electrode structure; and
an upper electrode disposed on the dielectric layer,
wherein the first lower electrode of the lower electrode structure is cylinder-shaped with a filled interior,
the first lower electrode of the lower electrode structure passes through the upper insulating layer and contacts a top surface of the contact structure,
the second lower electrode of the lower electrode structure is disposed on a side surface and a top surface of the first lower electrode of the lower electrode structure,
the third lower electrode of the lower electrode structure is disposed on a side surface and a top surface of the second lower electrode of the lower electrode structure,
the dielectric layer is disposed on a side surface and a top surface of the third lower electrode of the lower electrode structure, and contacts the supporter and the upper insulating layer, and
the dielectric layer does not contact the first lower electrode and the second lower electrode of the lower electrode structure.

17. The semiconductor device of claim 16, wherein the first lower electrode of the lower electrode structure includes at least one selected from among doped polysilicon, ruthenium, titanium, tantalum, tungsten, titanium nitride, tantalum nitride, tungsten nitride and iridium oxide,
the second lower electrode of the lower electrode structure includes niobium oxide, and
the third lower electrode of the lower electrode structure includes niobium nitride.

18. The semiconductor device of claim 16, wherein the dielectric layer includes hafnium oxide having a tetragonal crystalline phase, and at least one from among zirconium oxide, aluminum oxide, silicon oxide, titanium oxide, yttrium oxide, scandium oxide and lanthanum oxide.

19. The semiconductor device of claim 16, wherein the supporter contacts the first lower electrode, the second lower electrode and the third lower electrode of the lower electrode structure.

20. The semiconductor device of claim 16, wherein the upper insulating layer contacts the first lower electrode, the second lower electrode and the third lower electrode of the lower electrode structure.

* * * * *